(12) United States Patent
Lee et al.

(10) Patent No.: US 11,145,671 B2
(45) Date of Patent: Oct. 12, 2021

(54) THREE-DIMENSIONAL SEMICONDUCTOR MEMORY DEVICE AND METHOD OF MANUFACTURING THE SAME

(71) Applicant: SAMSUNG ELECTRONICS CO., LTD., Suwon-si (KR)

(72) Inventors: Haejoon Lee, Hwaseong-si (KR); Sung-Soo Ahn, Hwaseong-si (KR); Ha-Na Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 91 days.

(21) Appl. No.: 16/511,698

(22) Filed: Jul. 15, 2019

(65) Prior Publication Data

US 2020/0227434 A1 Jul. 16, 2020

(30) Foreign Application Priority Data

Jan. 15, 2019 (KR) .................. 10-2019-0005288

(51) Int. Cl.
*H01L 27/11582* (2017.01)
*H01L 27/11556* (2017.01)
*H01L 27/11526* (2017.01)
*H01L 23/522* (2006.01)
*H01L 27/11573* (2017.01)
(Continued)

(52) U.S. Cl.
CPC .... *H01L 27/11582* (2013.01); *H01L 23/5226* (2013.01); *H01L 27/11526* (2013.01); *H01L 27/11556* (2013.01); *H01L 27/11573* (2013.01); *G11C 16/0483* (2013.01); *G11C 16/08* (2013.01); *G11C 16/24* (2013.01)

(58) Field of Classification Search
CPC ........... H01L 23/5226; H01L 27/11573; H01L 27/11556; H01L 27/11565; H01L 23/522; H01L 27/11582; H01L 27/11526; G11C 16/08; G11C 16/24; G11C 16/0483
See application file for complete search history.

(56) References Cited

U.S. PATENT DOCUMENTS 8,530,350 B2    9/2013   Freeman et al.
8,659,070 B2    2/2014   Tanaka et al.
(Continued)

FOREIGN PATENT DOCUMENTS

KR    10-2017-0083948 A    7/2017
KR    10-2018-0007811 A    1/2018

*Primary Examiner* — Thanh T Nguyen
(74) *Attorney, Agent, or Firm* — Sughrue Mion, PLLC

(57) ABSTRACT

A three-dimensional semiconductor memory device is provided. The memory device includes a substrate with a cell array region and a connection region adjacent to the cell array region, the connection region including a first pad region and a second pad region; an electrode structure including electrodes stacked on the substrate, the electrode structure including an upper portion forming an upper staircase structure; a first dummy structure laterally spaced apart from the upper portion of the electrode structure and provided on the first pad region; and a second dummy structure laterally spaced apart from the upper portion of the electrode structure and provided on the second pad region. Each of the first dummy structure and the second dummy structure includes a dummy staircase structure, and the first dummy structure is located at higher level than the second dummy structure.

20 Claims, 26 Drawing Sheets

(51) Int. Cl.
    *G11C 16/04*     (2006.01)
    *G11C 16/08*     (2006.01)
    *G11C 16/24*     (2006.01)

(56) References Cited

U.S. PATENT DOCUMENTS

| | | |
|---|---|---|
| 9,455,268 B2 | 9/2016 | Oh et al. |
| 9,620,513 B2 | 4/2017 | Lee et al. |
| 9,633,944 B2 | 4/2017 | Kim |
| 9,728,448 B1 | 8/2017 | Noh |
| 10,049,744 B2 | 8/2018 | Jeong et al. |
| 2017/0040254 A1 | 2/2017 | Hwang et al. |
| 2017/0179025 A1 | 6/2017 | Yun et al. |
| 2017/0200676 A1* | 7/2017 | Jeong ................ H01L 21/76816 |
| 2018/0026047 A1 | 1/2018 | Park et al. |
| 2018/0053686 A1 | 2/2018 | Hyun et al. |

\* cited by examiner

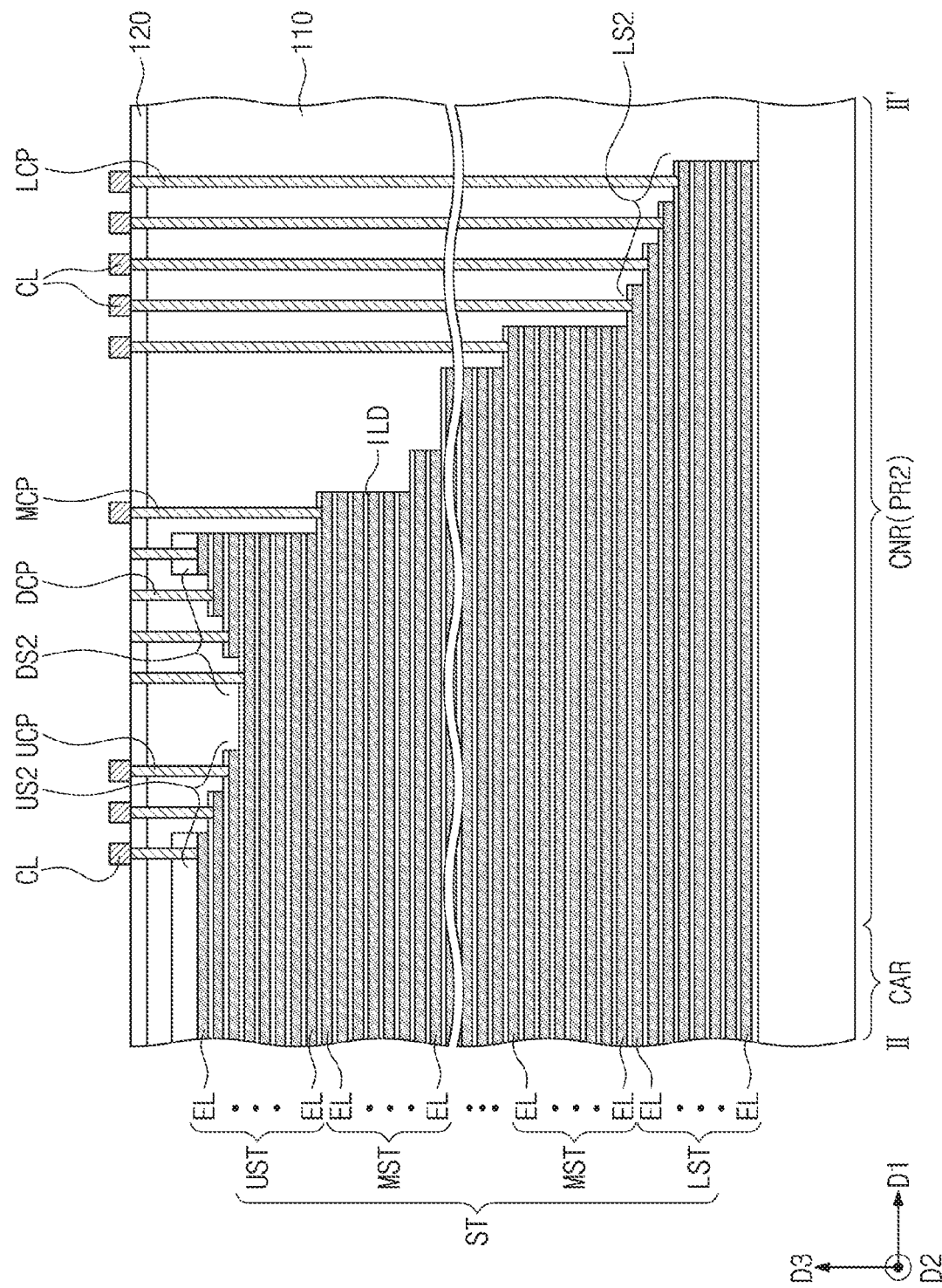

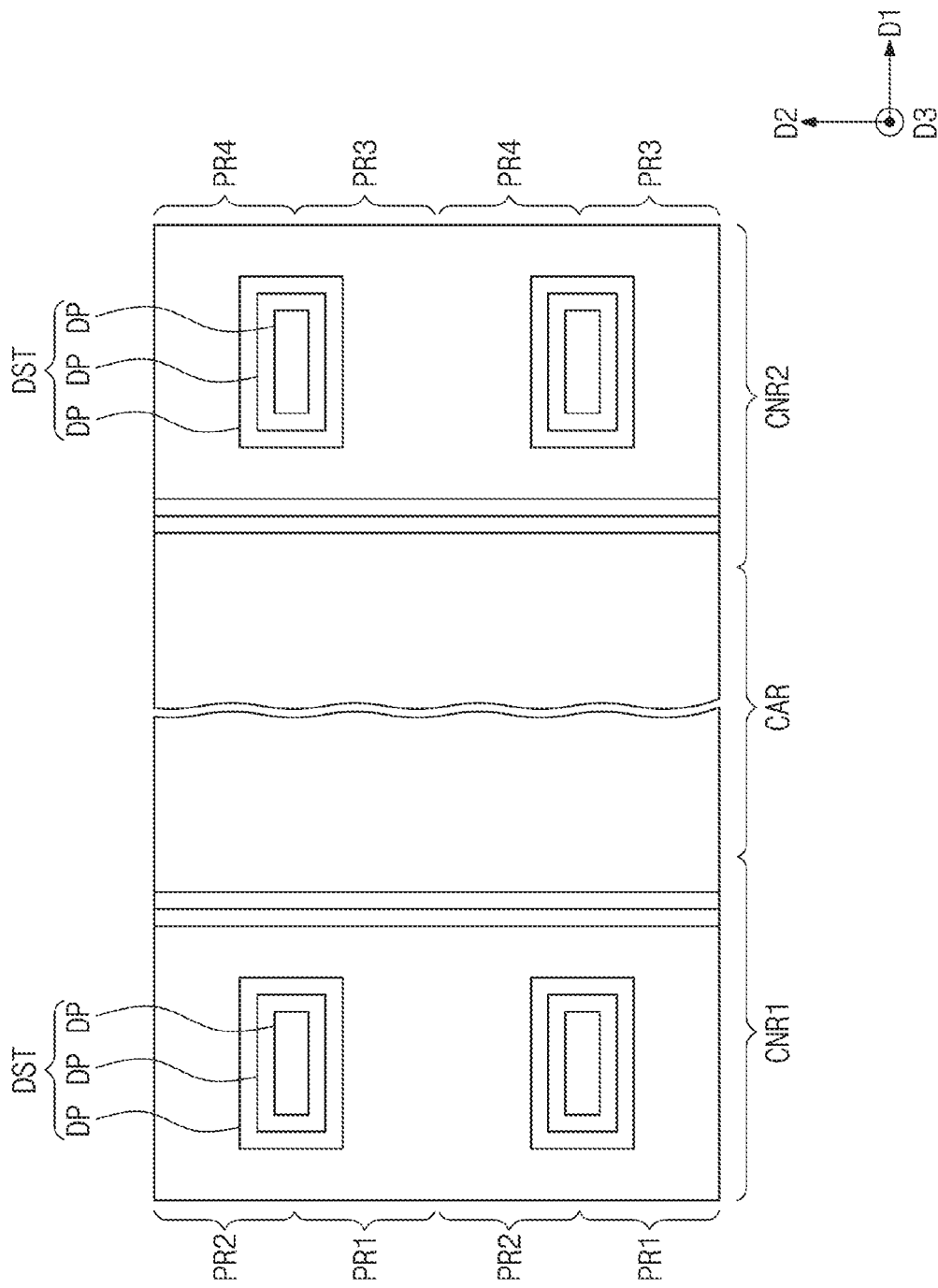

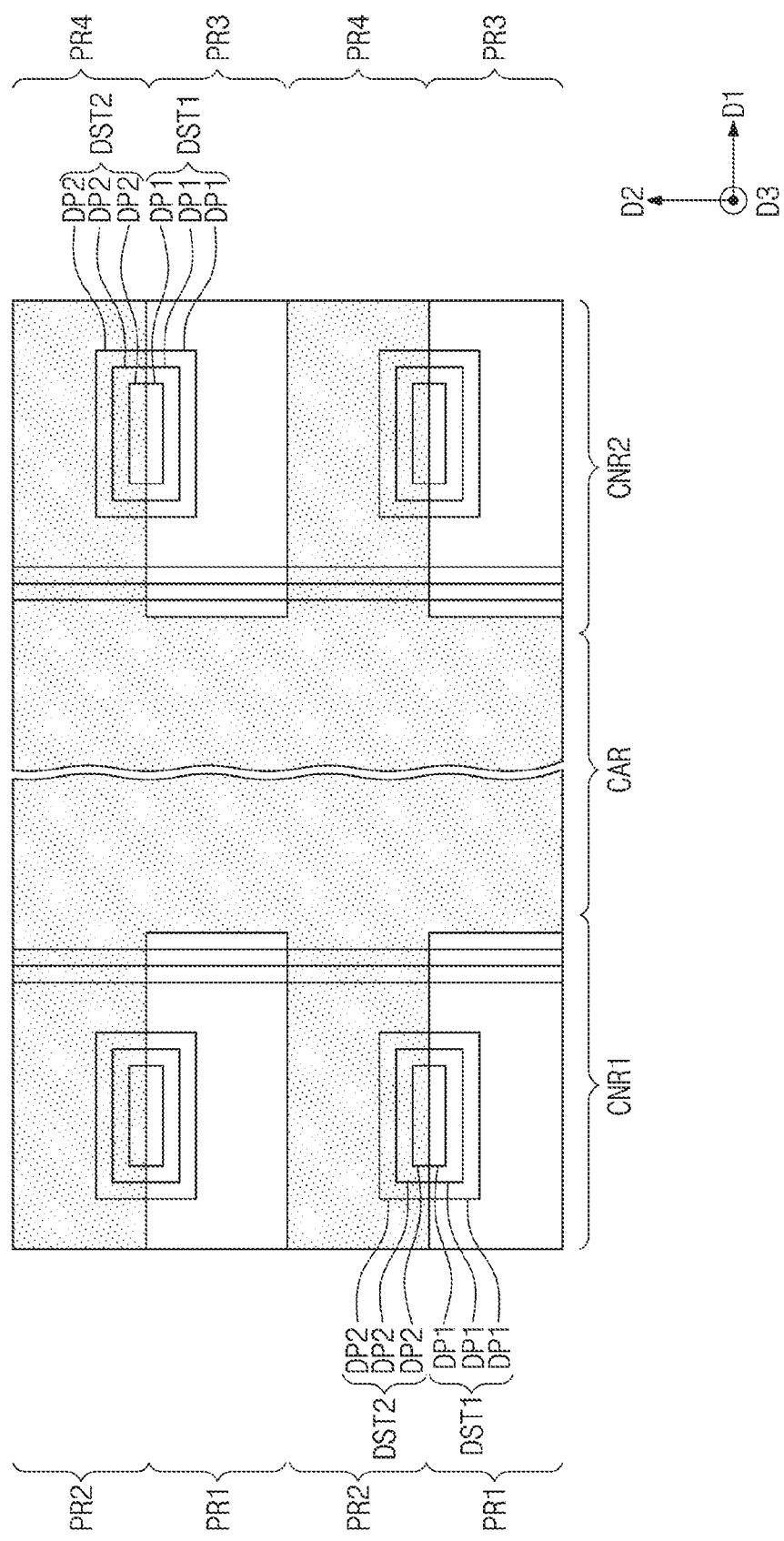

FIG. 21B
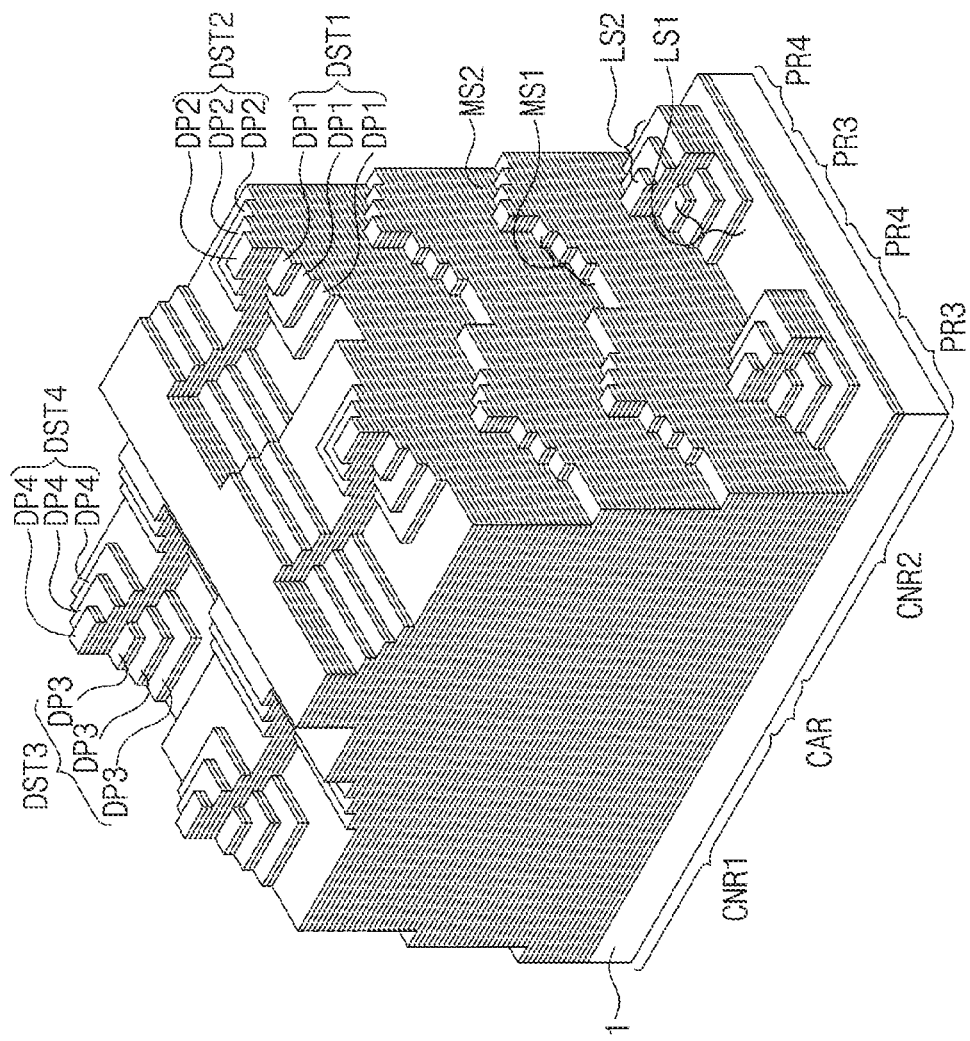
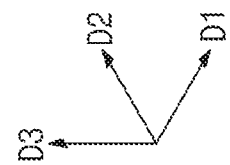

THREE-DIMENSIONAL SEMICONDUCTOR MEMORY DEVICE AND METHOD OF MANUFACTURING THE SAME

CROSS-REFERENCE TO THE RELATED APPLICATION

This application claims priority from Korean Patent Application No. 10-2019-0005288, filed on Jan. 15, 2019 in the Korean Intellectual Property Office, the disclosure of which is incorporated by reference herein in its entirety.

BACKGROUND

1. Field

Apparatuses and methods consistent with example embodiments relate to a three-dimensional (3D) semiconductor device and, more particularly, to a highly integrated 3D semiconductor memory device and a method of manufacturing the same.

2. Related Art

Semiconductor devices have become increasingly integrated, providing improved performance and lower manufacturing costs. The integration density of semiconductor devices directly affects the costs of the semiconductor devices, therefore there is an increased demand for highly integrated semiconductor devices. The integration density of typical two-dimensional (2D) or planar semiconductor devices corresponds to an area occupied by a unit memory cell. Therefore, the integration density of the typical 2D or planar semiconductor devices may be greatly affected by a technique of forming fine patterns. However, because extremely high-priced apparatuses are needed to form fine patterns, the integration density of 2D semiconductor devices is limited. Thus, 3D semiconductor memory devices are needed to overcome the above limitations. 3D semiconductor memory devices may include memory cells three-dimensionally arranged.

SUMMARY

One or more example embodiments provide a 3D semiconductor memory device with an increased integration density.

One or more example embodiments provide a method of manufacturing a 3D semiconductor memory device with an increased integration density.

According to an aspect of an example embodiment, there is provided a method of manufacturing a three-dimensional semiconductor memory device, the method including: preparing a substrate including a cell array region and a connection region adjacent to the cell array region in a first direction, the connection region including a first pad region and a second pad region arranged in a second direction, the second direction intersecting the first direction; forming a thin-layer structure on the substrate, the thin-layer structure including alternately stacked horizontal layers and insulating layers; forming a dummy structure by repeatedly performing a single-layer etching process on a portion of the thin-layer structure on the first pad region and the second pad region; forming a first dummy structure on the first pad region and a second dummy structure on the second pad region by performing a first multi-layer etching process on a portion of the dummy structure and a portion of the thin-layer structure on the first pad region, the first dummy structure and the second dummy structure being located at different levels from the substrate; and forming an electrode structure by repeatedly performing a second multi-layer etching process on portions of the first dummy structure, the second dummy structure and another portion of the thin-layer structure on the first pad region and the second pad region.

According to an aspect of an example embodiment, there is provided a method of manufacturing a three-dimensional semiconductor memory device, the method including: preparing a substrate including a cell array region and a connection region adjacent to the cell array region; forming a thin-layer structure on the substrate, the thin-layer structure including alternately stacked horizontal layers and insulating layers; forming a dummy structure by repeatedly performing a single-layer etching process on a portion of the thin-layer structure on the connection region, the dummy structure including: first staircase structures that face away from each other and are formed along a first direction; and second staircase structures that face away from each other and are formed along a second direction, the second direction intersecting the first direction; forming a first dummy structure and a second dummy structure at different levels from the substrate by performing a first multi-layer etching process on a portion of the dummy structure and the thin-layer structure; and forming an electrode structure by repeatedly performing a second multi-layer etching process on portions of the first dummy structure, the second dummy structure and the thin-layer structure.

According to an aspect of an example embodiment, there is provided a three-dimensional semiconductor memory device including: a substrate including a cell array region and a connection region adjacent to the cell array region in a first direction, the connection region including a first pad region and a second pad region adjacent to each other in a second direction, the second direction intersecting the first direction; an electrode structure including a plurality of electrodes vertically stacked on the substrate, the electrode structure including an upper portion forming an upper staircase structure along the first direction on the connection region; a first dummy structure laterally spaced apart from the upper portion of the electrode structure and provided on the first pad region; and a second dummy structure laterally spaced apart from the upper portion of the electrode structure and provided on the second pad region. Each of the first dummy structure and the second dummy structure includes a dummy staircase structure formed along the first direction and the second direction, and the first dummy structure is located at a first level from the substrate, and the second dummy structure is located at a second level from the substrate, the second level being higher than the first level.

According to an aspect of an example embodiment, there is provided a 3D semiconductor memory device including: a substrate including a cell array region, a first connection region and a second connection region spaced apart from each other in a first direction, the cell array region being interposed between the first connection region and the second connection region, the first connection region including a first pad region and a second pad region arranged in a second direction, the second direction intersecting the first direction, and the second connection region including a third pad region and a fourth pad region arranged in the second direction; an electrode structure including a plurality of electrodes vertically stacked on the substrate; and a plurality of dummy structures, the plurality of dummy structures including a first dummy structure disposed on the first pad region, a second dummy structure disposed on the second pad region, a third dummy structure disposed on the third pad region and a fourth dummy structure disposed on the fourth pad region, wherein each of the plurality of dummy structures includes dummy patterns vertically stacked on the electrode structure. Each of the plurality of dummy structures is located at a different level from the substrate.

According to an aspect of an example embodiment, there is provided a three-dimensional semiconductor memory device including: a substrate including a cell array region and a connection region adjacent to the cell array region; an electrode structure including a plurality of electrodes vertically stacked on the substrate, the electrode structure including an upper portion having an upper staircase structure formed along a first direction on the connection region; a first dummy structure laterally spaced apart from the upper portion of the electrode structure and including first dummy patterns vertically stacked; and a second dummy structure laterally spaced apart from the upper portion of the electrode structure and including second dummy patterns vertically stacked. Each of the first dummy structure and the second dummy structure includes a dummy staircase structure formed along both the first direction and a second direction, the second direction intersecting the first direction, and the first dummy structure is located at a first level from the substrate, and the second dummy structure is located at a second level higher than the first level.

BRIEF DESCRIPTION OF THE DRAWINGS

The above and other aspects, features and advantages will be more clearly understood from the following detailed description taken in conjunction with the accompanying drawings in which:

FIGS. 4A and 4B are cross-sectional views taken along lines I-I' and II-II' of FIG. 3, respectively;

FIGS. 18A, 19A, 20A and 21A are plan views illustrating a method of manufacturing an electrode structure of a 3D semiconductor memory device according to one or more example embodiments;

FIGS. 18B, 19B, 20B and 21B are perspective views illustrating a method of manufacturing an electrode structure of a 3D semiconductor memory device according to one or more example embodiments.

DETAILED DESCRIPTION 3D semiconductor memory devices and methods of manufacturing the same according to one or more example embodiments will be described more fully hereinafter with reference to the accompanying drawings.

Figure 1:
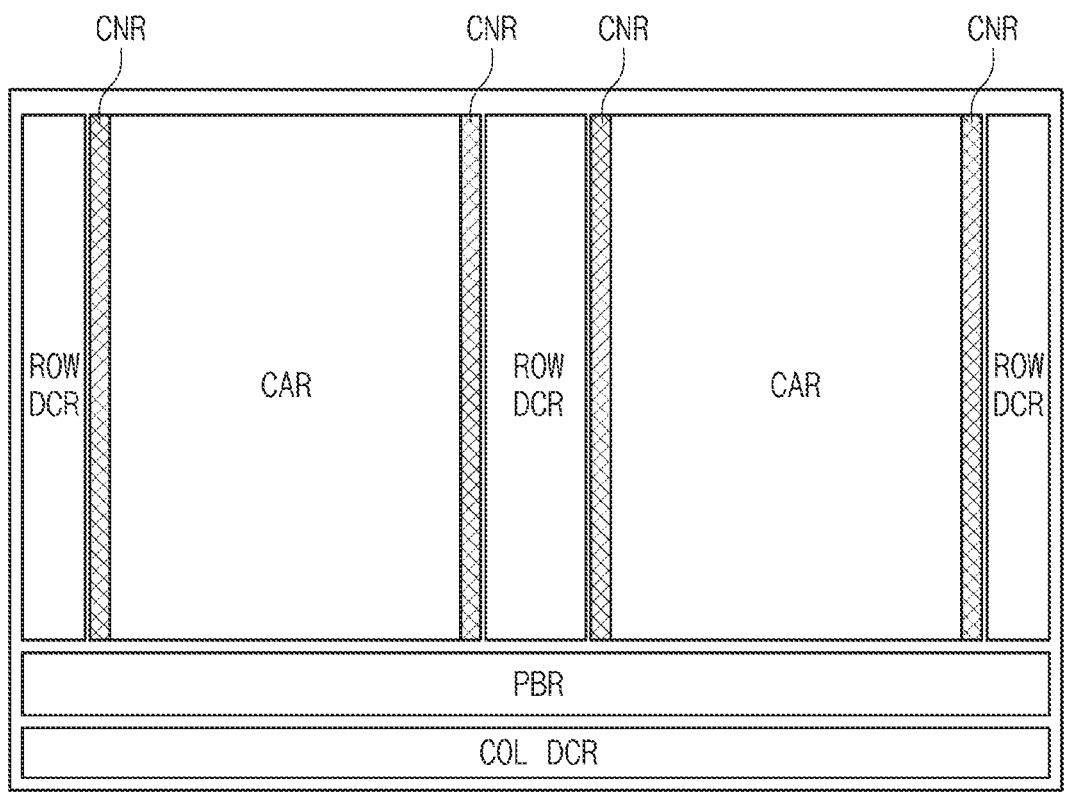
FIG. 1 is a schematic view illustrating a 3D semiconductor memory device according to one or more example embodiments.

FIG. 1 is a schematic view illustrating a 3D semiconductor memory device according to one or more example embodiments.

Referring to FIG. 1, a 3D semiconductor memory device may include a cell array region CAR and a peripheral circuit region. The peripheral circuit region may include row decoder regions ROW DCR, a page buffer region PBR, a column decoder region COL DCR, and a control circuit region. In one or more example embodiments, a connection region CNR may be disposed between the cell array region CAR and the row decoder region ROW DCR.

A memory cell array including a plurality of memory cells may be disposed in the cell array region CAR. In one or more example embodiments, the memory cell array may include three-dimensionally arranged memory cells, word lines, and bit lines. The word lines and the bit lines may be electrically connected to the memory cells.

A row decoder for selecting the word lines of the memory cell array may be disposed in the row decoder region ROW DCR, and an interconnection structure may be disposed in the connection region CNR. The interconnection structure may include contact plugs and interconnection lines, which electrically connect the memory cell array to the row decoder. The row decoder may select one among the word lines of the memory cell array based on an address signal. The row decoder may respectively provide a first word line voltage and a second word line voltage to the selected word line and unselected word lines according to a control signal of a control circuit.

A page buffer for sensing data stored in the memory cells may be disposed in the page buffer region PBR. According to an operation mode, the page buffer may temporarily store data to be stored in the memory cells or may sense data stored in the memory cells. The page buffer may operate as a write driver circuit in a program operation mode and may operate as a sense amplifier circuit in a read operation mode.

A column decoder connected to the bit lines of the memory cell array may be disposed in the column decoder region COL DCR. The column decoder may provide a data transmission path between the page buffer and an external device (e.g., a memory controller).

Figure 2:
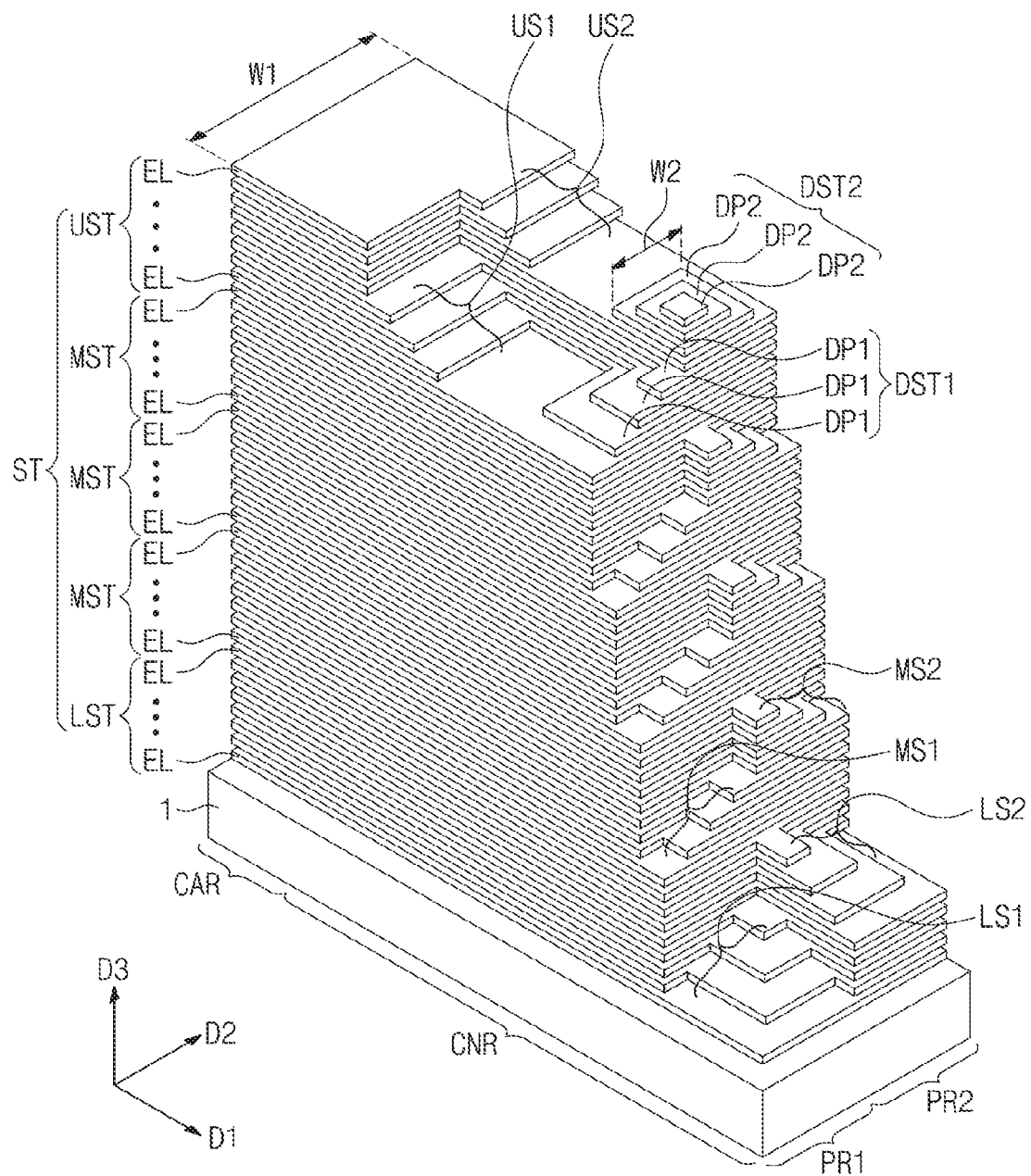
FIG. 2 is a perspective view illustrating an electrode structure of a 3D semiconductor memory device according to one or more example embodiments.
Figure 3:
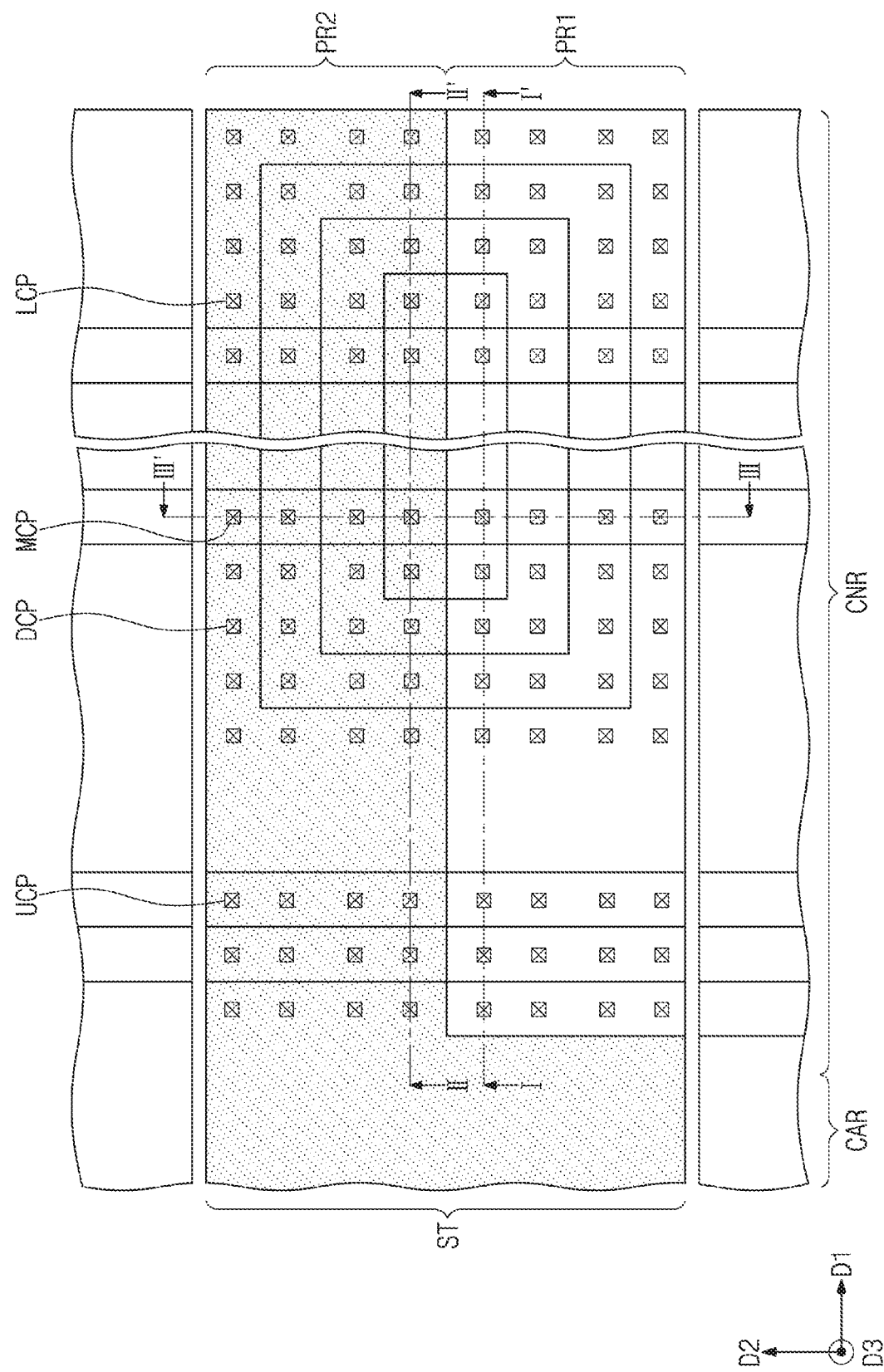
FIG. 3 is a plan view illustrating a 3D semiconductor memory device according to one or more example embodiments.
Figure 4A:
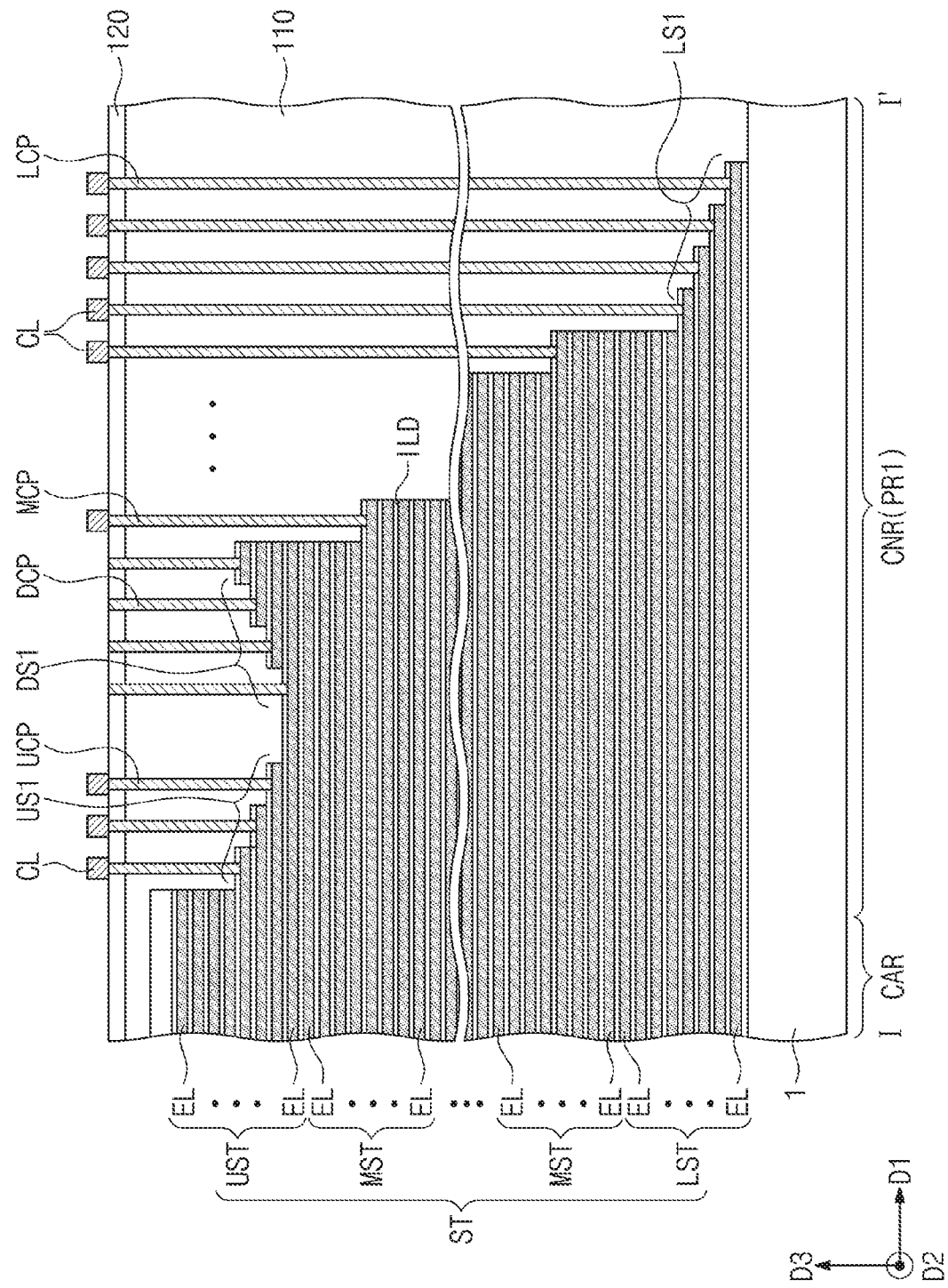
Figure 5:
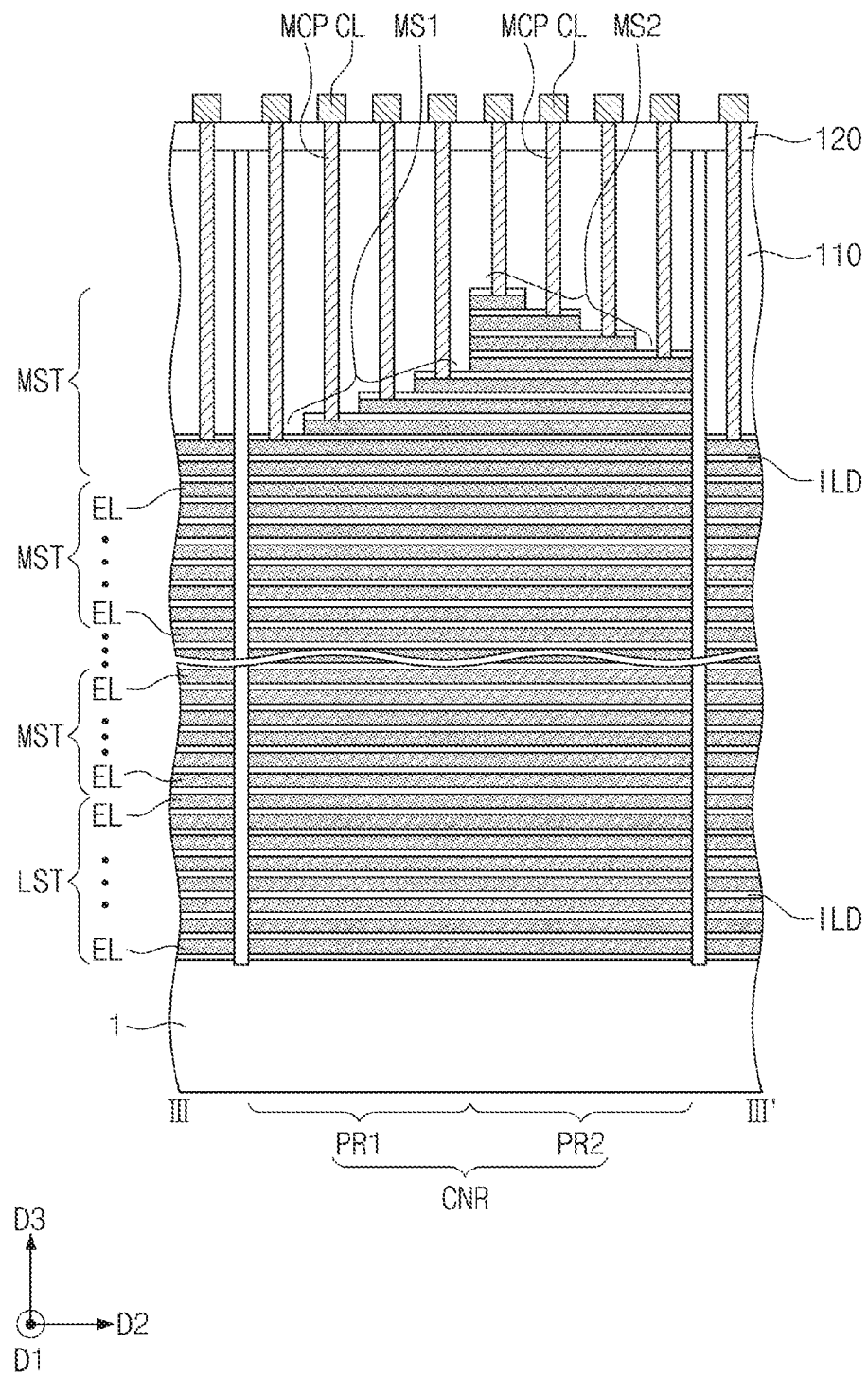
FIG. 5 is a cross-sectional view taken along a line III-III' of FIG. 3.

FIG. 2 is a perspective view illustrating an electrode structure of a 3D semiconductor memory device according to one or more example embodiments. FIG. 3 is a plan view illustrating a 3D semiconductor memory device according to one or more example embodiments. FIGS. 4A and 4B are cross-sectional views taken along lines I-I' and II-II' of FIG. 3, respectively. FIG. 5 is a cross-sectional view taken along a line III-III' of FIG. 3.

Referring to FIGS. 2, 3, 4A, 4B and 5, an electrode structure ST may be disposed on a substrate 1 that includes a connection region CNR and a cell array region CAR.

In one or more example embodiments, the connection region CNR may be adjacent to the cell array region CAR in a first direction D1 parallel to a top surface of the substrate 1, and may include a first pad region PR1 and a second pad region PR2. The first pad region PR1 and the second pad region PR2 may be adjacent to each other in a second direction D2 which is parallel to the top surface of the substrate 1 and intersects the first direction D1.

The electrode structure ST may include electrodes EL and insulating layers ILD which are alternately and repeatedly stacked in a third direction D3 perpendicular to the top surface of the substrate 1. The electrodes EL may be formed of a conductive material (e.g., a doped semiconductor material or a metal). Each of the electrodes EL may have a pad portion which is exposed by another electrode located directly thereon on the connection region CNR. The insulating layers ILD may be formed of an insulating material such as silicon oxide.

In more detail, the electrode structure ST may include a lower structure LST, middle structures MST, and an upper structure UST. The lower, middle and upper structures LST, MST and UST may each include the same number of the electrodes EL.

In one or more example embodiments, each of the lower, middle and upper structures LST, MST and UST may include 2n electrodes EL where 'n' is a natural number of 1 or more. For example, each of the lower, middle and upper structures LST, MST and UST may include eight electrodes EL, as illustrated in FIG. 2. However, example embodiments are not limited thereto.

The electrodes EL of the lower structure LST may form a first lower staircase structure LS1 on the first pad region PR1 and a second lower staircase structure LS2 on the second pad region PR2. Here, each of the first and second lower staircase structures LS1 and LS2 may be formed by a plurality of the electrodes EL stacked continuously, and the first and second lower staircase structures LS1 and LS2 may be disposed at different levels from the substrate 1.

Each of the first and second lower staircase structures LS1 and LS2 may include single-layered stairs. In one or more example embodiments, the single-layered stair may include one electrode EL, and a height of the single-layered stair may be substantially equal to or less than a vertical pitch of the electrodes EL.

Each of the first and second lower staircase structures LS1 and LS2 may be formed along both the first and second directions D1 and D2. In other words, each of the first and second lower staircase structures LS1 and LS2 may have a pyramidal staircase structure.

The electrodes EL constituting each of the middle structures MST may have sidewalls vertically aligned with each other. The electrodes EL of each of the middle structures MST may form a first middle staircase structure MS1 on the first pad region PR1 and a second middle staircase structure MS2 on the second pad region PR2. Here, the first middle staircase structure MS1 and the second middle staircase structure MS2 may be disposed at different levels from the substrate 1. A level difference between the first middle staircase structure MS1 and the second middle staircase structure MS2 may be substantially equal to a level difference between the first lower staircase structure LS1 and the second lower staircase structure LS2.

Each of the first and second middle staircase structures MS1 and MS2 may be formed along the second direction D2 by a plurality of the electrodes EL stacked continuously. Each of the first and second middle staircase structures MS1 and MS2 may include single-layered stairs.

The middle structures MST may be stacked in the third direction D3, and lengths of the middle structures MST in the first direction D1 may decrease sequentially as a vertical distance from the substrate 1 increases. A staircase structure consisting of multi-layered stairs may be formed along the first direction D1 by the middle structures MST. Here, the multi-layered stair may include at least two or more electrodes EL, and a height of the multi-layered stair may be equal to or greater than about twice the vertical pitch of the electrodes EL.

The upper structure UST may be disposed on an uppermost one of the middle structures MST, and the electrodes EL of the upper structure UST may form a first upper staircase structure US1 on the first pad region PR1 and a second upper staircase structure US2 on the second pad region PR2. Here, each of the first and second upper staircase structures US1 and US2 may include single-layered stairs. The first upper staircase structure US1 and the second upper staircase structure US2 may be disposed at different levels from the substrate 1. Each of the first and second upper staircase structures US1 and US2 may be formed along the first direction D1 by a plurality of the electrodes EL stacked continuously. A level difference between the first upper staircase structure US1 and the second upper staircase structure US2 may be substantially equal to the level difference between the first middle staircase structure MS1 and the second middle staircase structure MS2.

In one or more example embodiments, first and second dummy structures DST1 and DST2 may be horizontally spaced apart from the upper structure UST and may be disposed on the uppermost middle structure MST.

The first dummy structure DST1 may be provided on the first pad region PR1 and may include first dummy patterns DP1 vertically stacked. The first dummy patterns DP1 may form a first dummy staircase structure DS1 which is formed of single-layered stairs along the first direction D1 and the second direction D2. The first dummy staircase structure DS1 may be formed at the same level as the first upper staircase structure US1 of the upper structure UST.

The second dummy structure DST2 may be provided on the second pad region PR2 and may include second dummy patterns DP2 vertically stacked. In one or more example embodiments, the second dummy structure DST2 may be located at a higher level than the first dummy structure DST1.

The second dummy patterns DP2 may form a second dummy staircase structure DS2 which is formed of single-layered stairs along the first direction D1 and the second direction D2. The second dummy staircase structure DS2 may be formed at the same level as the second upper staircase structure US2 of the upper structure UST.

One of the sidewalls of each of the first and second dummy patterns DP1 and DP2 may be vertically aligned with one of the sidewalls of each of the electrodes EL of the middle structure MST located thereunder.

In one or more example embodiments, the electrode structure ST may have a first width W1 in the second direction D2 on the cell array region CAR. In other words, each of the electrodes EL may have the first width W1 in the second direction D2 on the cell array region CAR.

Each of the first and second dummy structures DST1 and DST2 may have a second width W2 in the second direction D2, which is less than half of the first width W1. In more detail, widths of the first dummy patterns DP1 in the second direction D2 may be different from each other in the first dummy structure DST1, and widths of the second dummy patterns DP2 in the second direction D2 may be different from each other in the second dummy structure DST2.

A filling insulation layer 110 may cover the electrode structure ST and the first and second dummy structures DST1 and DST2 on the cell array region CAR and the connection region CNR of the substrate 1. The filling insulation layer 110 may have a flat top surface.

Contact plugs UCP, MCP and LCP may be respectively connected to the electrodes EL of the electrode structure ST on the first and second pad regions PR1 and PR2. Upper contact plugs UCP may be connected to the electrodes EL of the upper structure UST, respectively. Middle contact plugs MCP may be connected to the electrodes EL of the middle structures MST, respectively. Lower contact plugs LCP may be connected to the electrodes EL of the lower structure LST, respectively. In addition, dummy contact plugs DCP may be connected to the first and second dummy patterns DP1 and DP2 of the first and second dummy structures DST1 and DST2, respectively. Top surfaces of the contact plugs UCP, MCP and LCP and top surfaces of the dummy contact plugs DCP may be located at substantially the same level.

An interlayer insulating layer 120 may be disposed on the filling insulation layer 110, and interconnection lines CL respectively connected to the contact plugs UCP, MCP and LCP may be disposed on the interlayer insulating layer 120.

Figure 6:
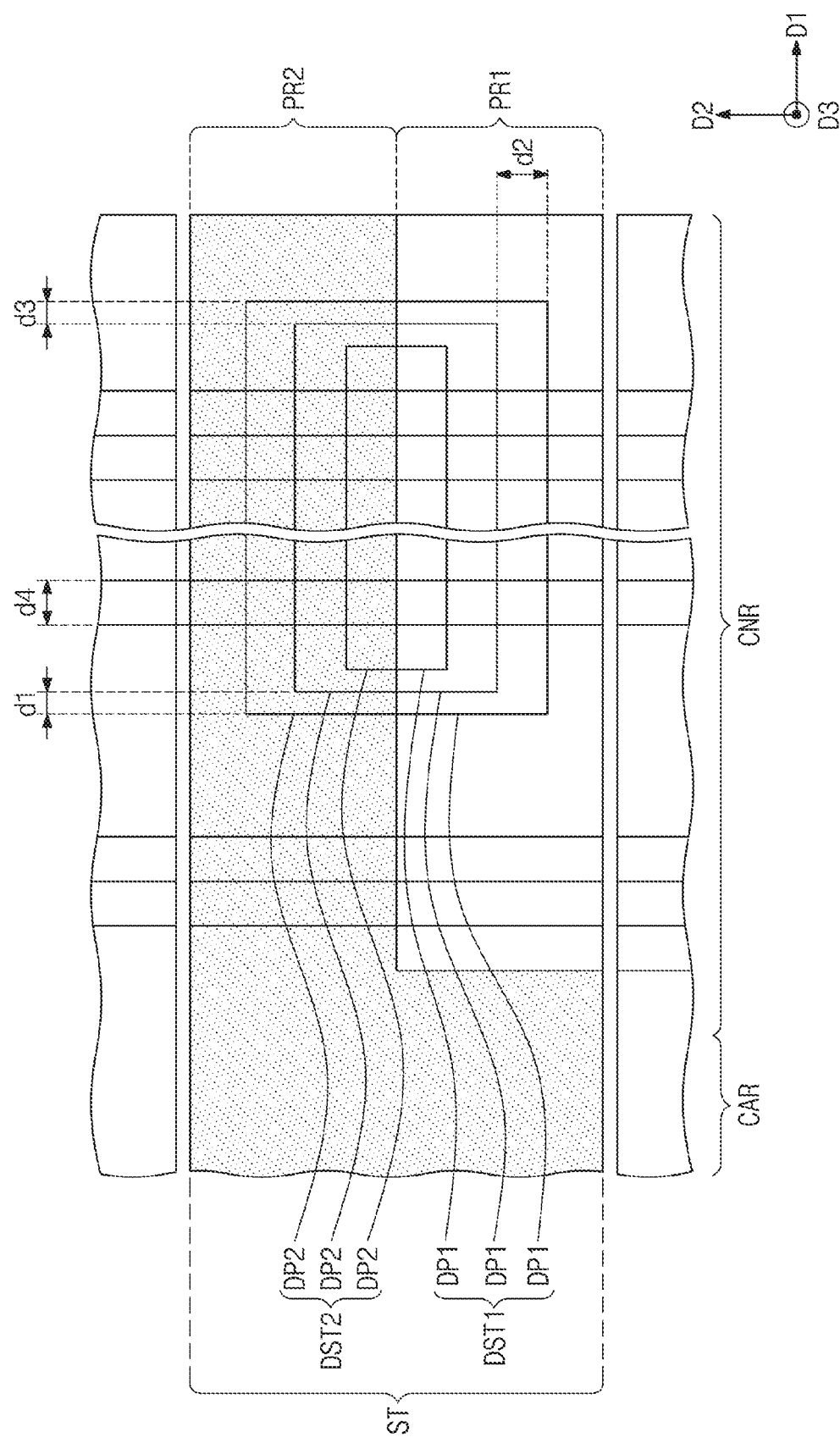
FIG. 6 is a plan view illustrating an electrode structure of a 3D semiconductor memory device according to one or more example embodiments.

FIG. 6 is a plan view illustrating an electrode structure of a 3D semiconductor memory device according to one or more example embodiments. Hereinafter, the descriptions of the same technical features as in the above example embodiments will be omitted or mentioned briefly for the purpose of ease and convenience in explanation.

Referring to FIG. 6, first and second dummy structures DST1 and DST2 may be disposed on the first and second pad regions PR1 and PR2, respectively. As described above, the first and second dummy structures may have first and second dummy staircase structures DS1 and DS2, respectively, and each of the first and second dummy staircase structures DS1 and DS2 may be formed in the first direction D1 and the second direction D2. In the first and second dummy staircase structures DS1 and DS2, a width d2 of each single-layered stair in the second direction D2 may be greater than a width d1 of each single-layered stair in the first direction D1.

As described above, the lower structure LST may include first and second lower staircase structures LS1 and LS2 on the first and second pad regions PR1 and PR2. In the first and second lower staircase structures LS1 and LS2, a width d2 of each single-layered stair in the second direction D2 may be greater than a width d3 of each single-layered stair in the first direction D1.

A width d4, in the first direction D1, of the multi-layered stair of each of the middle structures MST may be greater than the width d3, in the first direction D1, of each single-layered stair of the first and second lower staircase structures LS1 and LS2.

Figure 7:
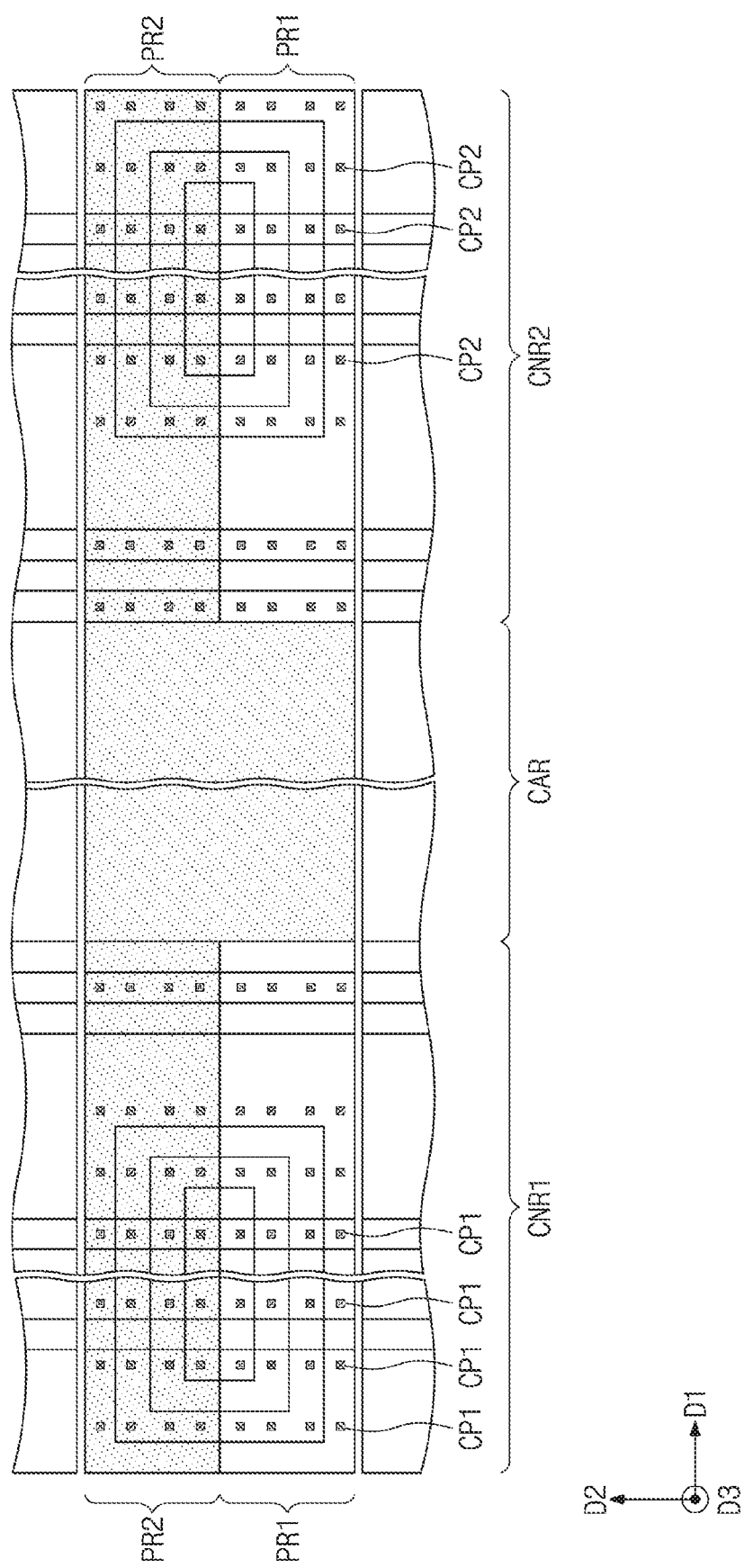
FIG. 7 is a plan view illustrating a 3D semiconductor memory device according to one or more example embodiments.
Figure 8:
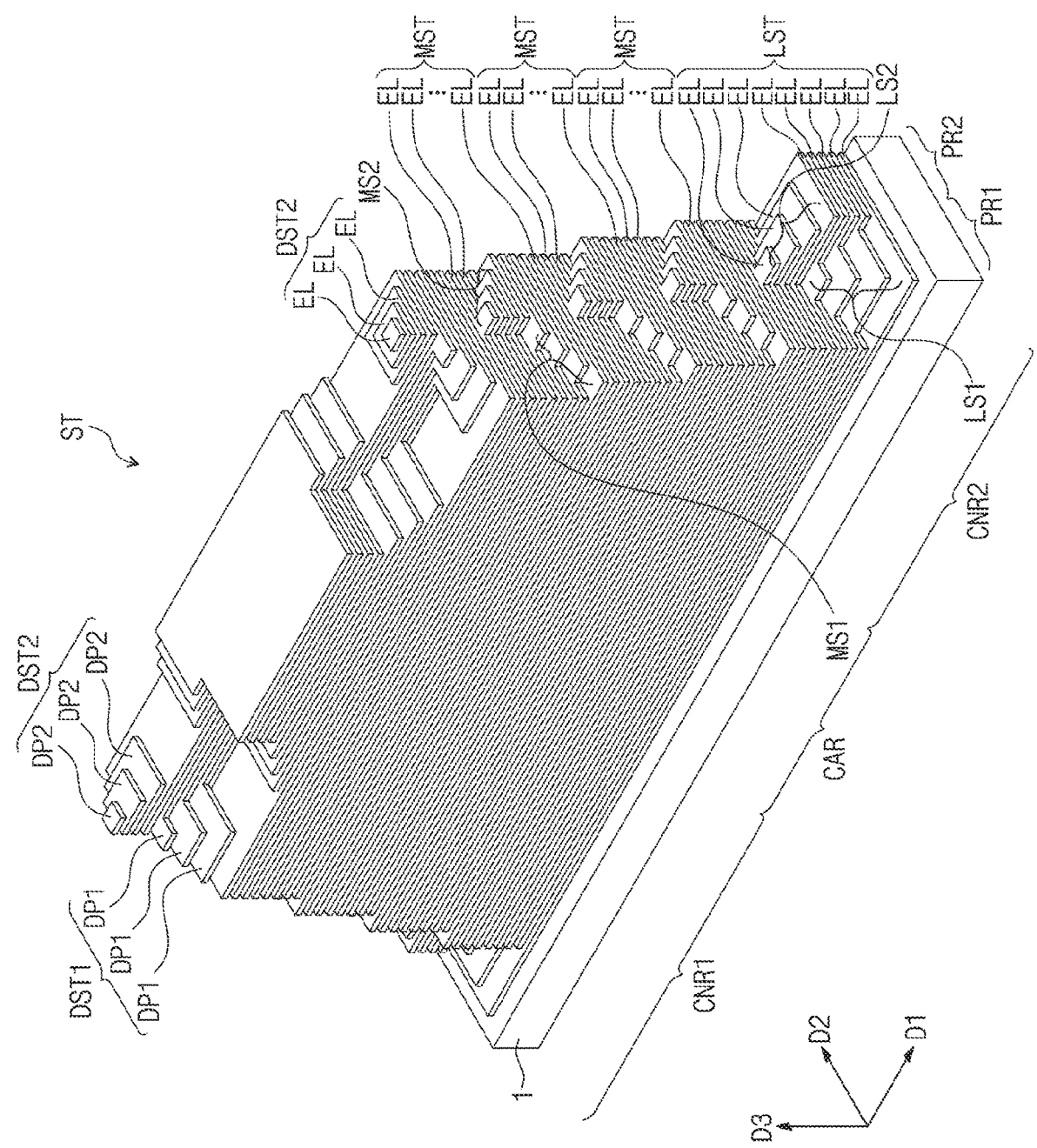
FIG. 8 is a perspective view illustrating an electrode structure of a 3D semiconductor memory device according to one or more example embodiments.

FIG. 7 is a plan view illustrating a 3D semiconductor memory device according to one or more example embodiments. FIG. 8 is a perspective view illustrating an electrode structure of a 3D semiconductor memory device according to one or more example embodiments. Hereinafter, the descriptions of the same technical features as in the above example embodiments will be omitted or mentioned briefly for the purpose of ease and convenience in explanation.

Referring to FIGS. 7 and 8, a substrate 1 may include first and second connection regions CNR1 and CNR2 spaced apart from each other in the first direction D1 and a cell array region CAR disposed between the first and second connection regions CNR1 and CNR2. Each of the first and second connection regions CNR1 and CNR2 may include first and second pad regions PR1 and PR2 adjacent to each other in the second direction D2.

In one or more example embodiments, an electrode structure ST may extend in the first direction D1 and may include the staircase structure features of the electrode structure ST described above on each of the first and second connection regions CNR1 and CNR2.

In detail, the staircase structures of the electrode structure ST may be mirror-symmetrical with respect to an imaginary line parallel to the second direction D2. In other words, on each of the first and second connection regions CNR1 and CNR2, the electrode structure ST may have the first and second lower staircase structures LS1 and LS2, the first and second middle staircase structures MS1 and MS2, and the first and second upper staircase structures US1 and US2, described with reference to FIGS. 2, 3, 4A, 4B and 5. As described above, the first and second lower staircase structures LS1 and LS2 may be located at different levels from the substrate 1, the first and second middle staircase structures MS1 and MS2 may be located at different levels from the substrate 1, and the first and second upper staircase structures US1 and US2 may be located at different levels from the substrate 1.

In addition, the first and second dummy structures DST1 and DST2 may be disposed on each of the first and second connection regions CNR1 and CNR2.

In one or more example embodiments, first contact plugs CP1 may be connected to the electrodes EL of even-numbered layers on the first connection region CNR1, respectively, and second contact plugs CP2 may be connected to the electrodes EL of odd-numbered layers on the second connection region CNR2, respectively. Thus, some of interconnection lines connected to the electrodes EL constituting one electrode structure ST may be disposed on the first connection region CNR1, and the others of the interconnection lines may be disposed on the second connection region CNR2.

Figure 9:
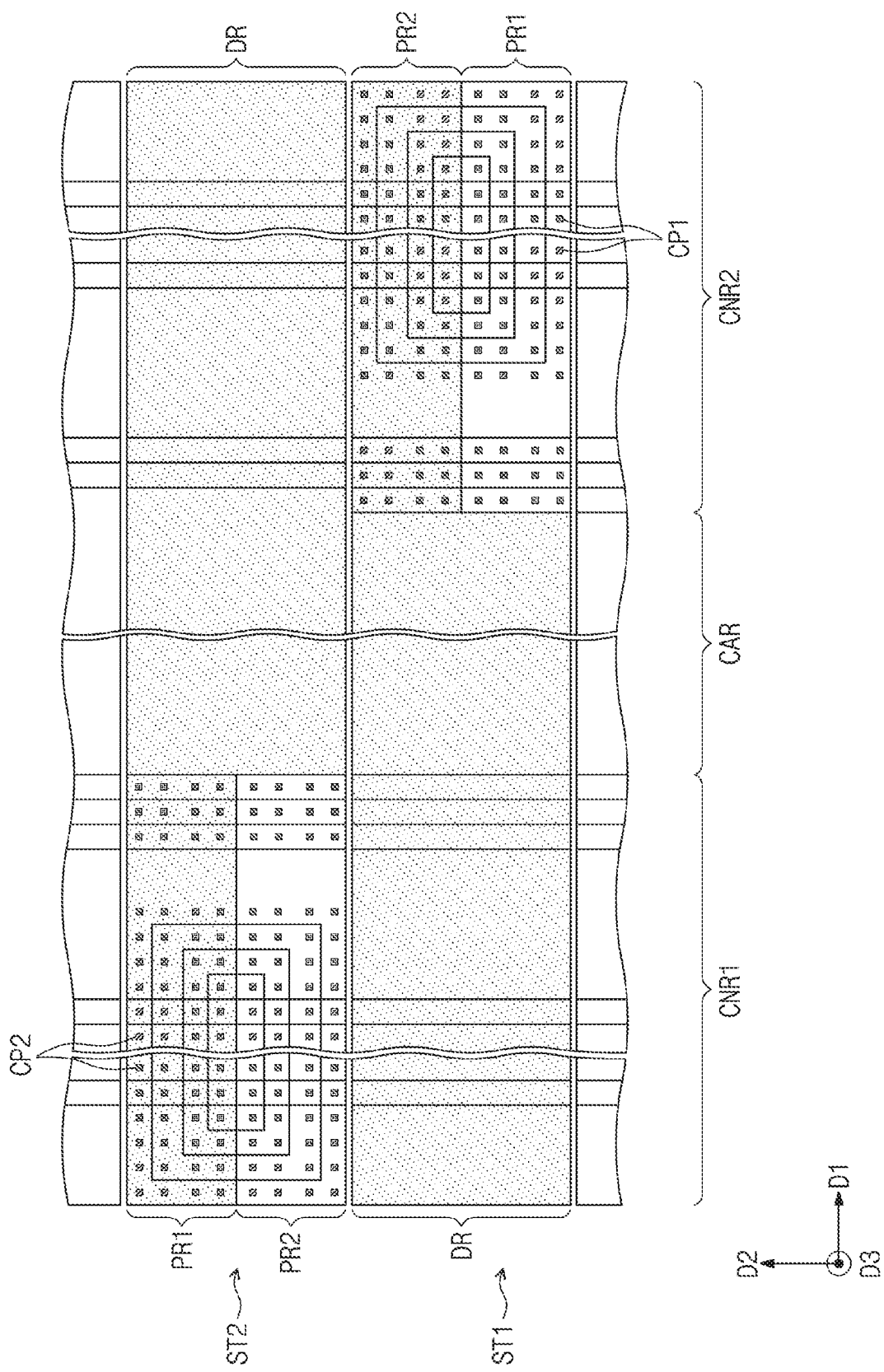
FIG. 9 is a plan view illustrating a 3D semiconductor memory device according to one or more example embodiments.
Figure 10:
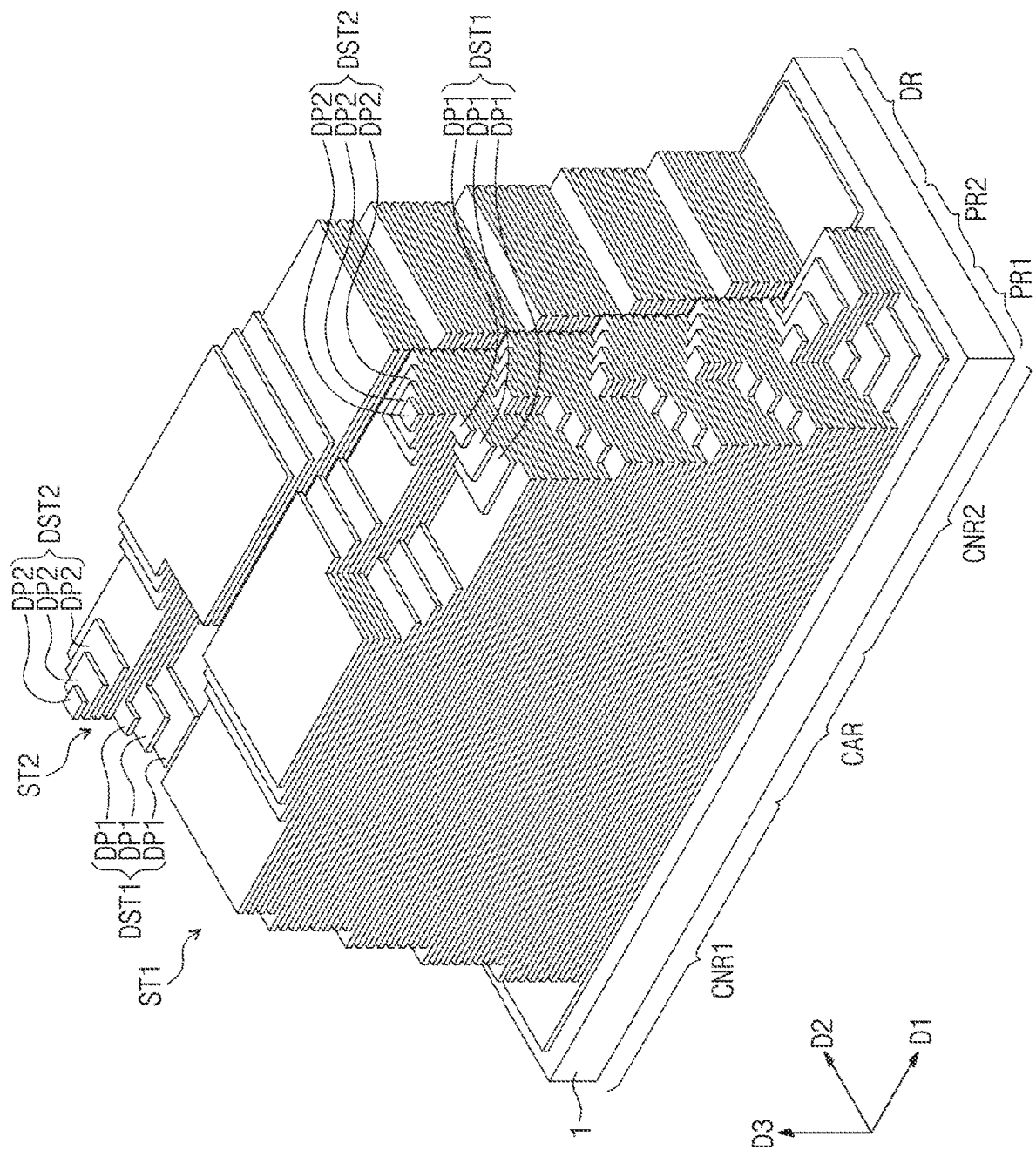
FIG. 10 is a perspective view illustrating an electrode structure of a 3D semiconductor memory device according to one or more example embodiments.

FIG. 9 is a plan view illustrating a 3D semiconductor memory device according to one or more example embodiments. FIG. 10 is a perspective view illustrating an electrode structure of a 3D semiconductor memory device according to one or more example embodiments. Hereinafter, the descriptions of the same technical features as in the above example embodiments will be omitted or mentioned briefly for the purpose of ease and convenience in explanation.

Referring to FIGS. 9 and 10, a substrate 1 may include first and second connection regions CNR1 and CNR2 and a cell array region CAR disposed between the first and second connection regions CNR1 and CNR2. In one or more example embodiments, first and second electrode structures ST1 and ST2 may be spaced apart from each other in the second direction D2 on the substrate 1. The first and second electrode structures ST1 and ST2 may extend in the first direction D1 on the substrate 1.

In one or more example embodiments, the first electrode structure ST1 may include the staircase structure features of the electrode structure ST described above on the second connection region CNR2, and the second electrode structure ST2 may include the staircase structure features of the electrode structure ST described above on the first connection region CNR1.

In detail, each of the first and second electrode structures ST1 and ST2 may include the lower structure LST, the upper structure UST, and a plurality of the middle structures MST sequentially stacked between the lower structure LST and the upper structure UST.

Each of the first and second electrode structures ST1 and ST2 may include staircase structures which are respectively disposed on the first and second connection regions CNR1 and CNR2 and are asymmetrical.

In detail, the first electrode structure ST1 may include the first and second lower staircase structures, the first and second middle staircase structures and the first and second upper staircase structures, described with reference to FIG. 2, on the second connection region CNR2.

In the first electrode structure ST1, one sidewall of each of at least two or more of the electrodes EL of the lower structure LST may be vertically aligned with each other on the first connection region CNR1. In the first electrode structure ST1, one sidewall of each of at least two or more of the electrodes EL of each of the middle structures MST may have be vertically aligned with each other on the first connection region CNR1.

The second electrode structure ST2 may include the first and second lower staircase structures, the first and second middle staircase structures and the first and second upper staircase structures, described with reference to FIG. 2, on the first connection region CNR1.

In the second electrode structure ST2, one sidewall of each of at least two or more of the electrodes EL of the lower structure LST may have be vertically aligned with each other on the second connection region CNR2. In the second electrode structure ST2, one sidewall of each of at least two or more of the electrodes EL of each of the middle structures MST may be vertically aligned with each other on the second connection region CNR2.

In one or more example embodiments, first contact plugs CP1 may be connected to the electrodes EL of the first electrode structure ST1 on the second connection region CNR2, respectively. Second contact plugs CP2 may be connected to the electrodes EL of the second electrode structure ST2 on the first connection region CNR1, respectively.

Figure 11:
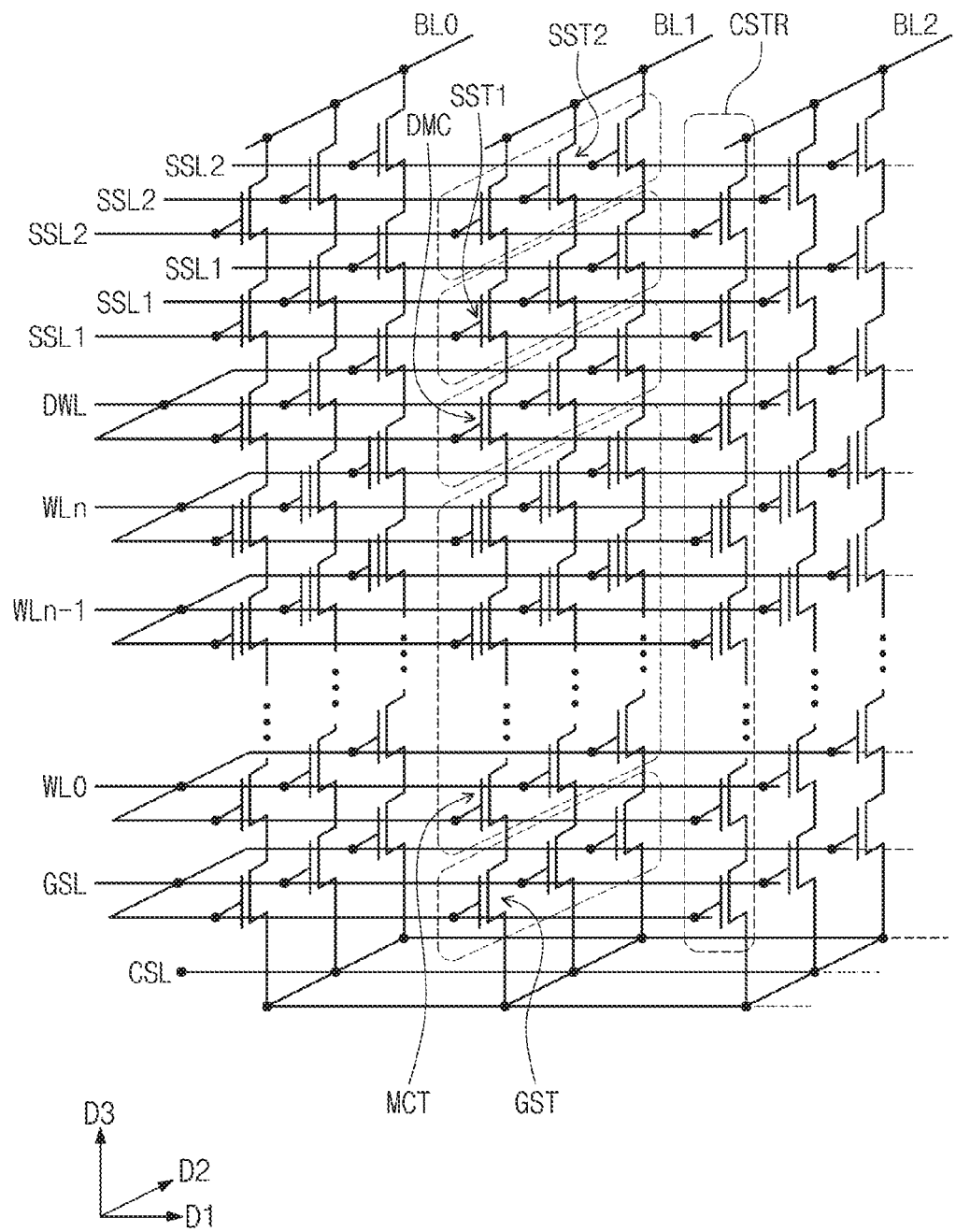
FIG. 11 is a schematic circuit diagram illustrating a memory cell array of a 3D semiconductor memory device according to one or more example embodiments.

FIG. 11 is a schematic circuit diagram illustrating a memory cell array of a 3D semiconductor memory device according to one or more example embodiments.

Referring to FIG. 11, a memory cell array of a 3D semiconductor memory device according to one or more example embodiments may include a common source line CSL, a plurality of bit lines BL0 to BL2, and a plurality of cell strings CSTR provided between the common source line CSL and the bit lines BL0 to BL2.

The cell strings CSTR may be disposed on a plane defined by first and second directions D1 and D2 and may extend in a third direction D3. The bit lines BL0 to BL2 may be spaced apart from each other in the first direction D1 and may extend in the second direction D2.

A plurality of the cell strings CSTR may be connected in parallel to each of the bit lines BL0 to BL2. The plurality of cell strings may include, a first plurality of cell strings connected to the bit line BL0, a second plurality of cell strings connected to the bit line BL1 and a third plurality of cell strings connected to the bit line BL2. The plurality of the cell strings CSTR may be connected in common to the common source line CSL. In other words, a plurality of the cell strings CSTR may be disposed between one common source line CSL and a plurality of the bit lines BL0 to BL2. The common source line CSL may be one of a plurality of common source lines CSL, and the plurality of common source lines CSL may be two-dimensionally arranged. In one or more example embodiments, the same voltage may be applied to the plurality of common source lines CSL. In certain example embodiments, the common source lines CSL may be electrically controlled independently of each other.

In one or more example embodiments, each of the cell strings CSTR may include a string selection transistor SST1 and a string selection transistor SST2 connected in series, memory cell transistors MCT connected in series to each other, and a ground selection transistor GST. Each of the memory cell transistors MCT may include a data storage element.

In one or more example embodiments, each of the cell strings CSTR may include a first string selection transistor SST1 and a second string selection transistor SST2 connected in series. The second string selection transistor SST2 may be connected to one of the bit lines BL0 to BL2, and the ground selection transistor GST may be connected to the common source line CSL. The memory cell transistors MCT may be connected in series between the first string selection transistor SST1 and the ground selection transistor GST.

In addition, each of the cell strings CSTR may further include a dummy cell transistor DMC connected between the first string selection transistor SST1 and the memory cell transistor MCT. Also, an additional dummy cell transistor may be connected between the ground selection transistor GST and the memory cell transistor MCT adjacent to the ground selection transistor GST. According to certain example embodiments, in each of the cell strings CSTR, the ground selection transistor GST may include a plurality of MOS transistors connected in series to each other, similarly to the first and second string selection transistors SST1 and SST2. In certain example embodiments, each of the cell strings CSTR may include a single string selection transistor.

In one or more example embodiments, the first string selection transistor SST1 may be controlled by a first string selection line SSL1, and the second string selection transistor SST2 may be controlled by a second string selection line SSL2. The memory cell transistors MCT may be controlled by word lines WL0 to WLn, respectively. The dummy cell transistor DMC may be controlled by a dummy word line DWL. The ground selection transistor GST may be controlled by a ground selection line GSL. The common source line CSL may be connected in common to sources of the ground selection transistors GST.

Gate electrodes of the memory cell transistors MCT (or the dummy cell transistors) disposed at substantially the same level from the common source lines CSL may be connected in common to one of the word lines WL0 to WLn and DWL so as to be in an equipotential state. Alternatively, even though the gate electrodes of the memory cell transistors MCT are disposed at substantially the same level from the common source lines CSL, the gate electrodes disposed in one row (or one column) may be controlled independently of the gate electrodes disposed in another row (or another column).

The ground selection lines GSL and the string selection lines SSL1 and SSL2 may extend in the first direction D1 and may be spaced apart from each other in the second direction D2. The ground selection lines GSL disposed at substantially the same level from the common source lines CSL may be electrically isolated from each other or be electrically connected to each other, and the string selection lines SSL1 or SSL2 disposed at substantially the same level from the common source lines CSL may be electrically isolated from each other.

In one or more example embodiments, the word lines WL0 to WLn and DWL may be configured to include the technical features of the electrode structure ST described above. In other words, the electrodes EL of the electrode structure ST according to the example embodiments may be used as the word lines for controlling the memory cell transistors of the cell strings.

Figure 12:
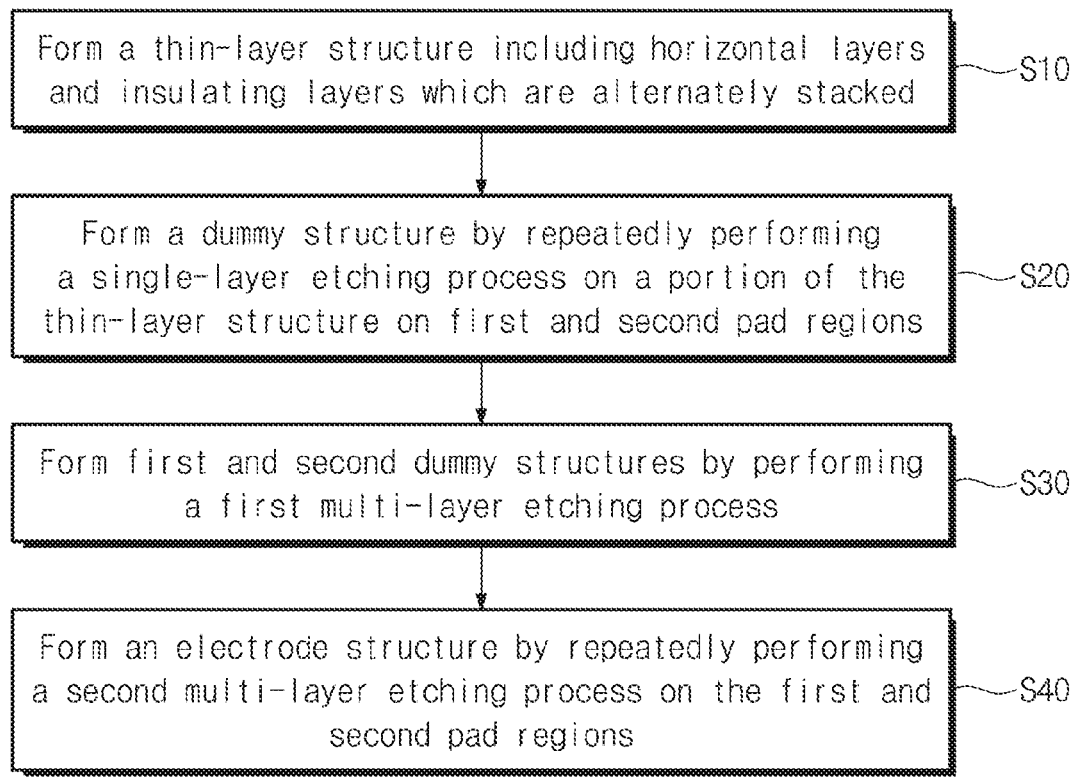
FIG. 12 is a flowchart illustrating a method of manufacturing an electrode structure of a 3D semiconductor memory device according to one or more example embodiments.

FIG. 12 is a flowchart illustrating a method of manufacturing an electrode structure of a 3D semiconductor memory device according to one or more example embodiments. FIGS. 13 to 17 are perspective views illustrating a method of manufacturing an electrode structure of a 3D semiconductor memory device according to one or more example embodiments.

Figure 13:
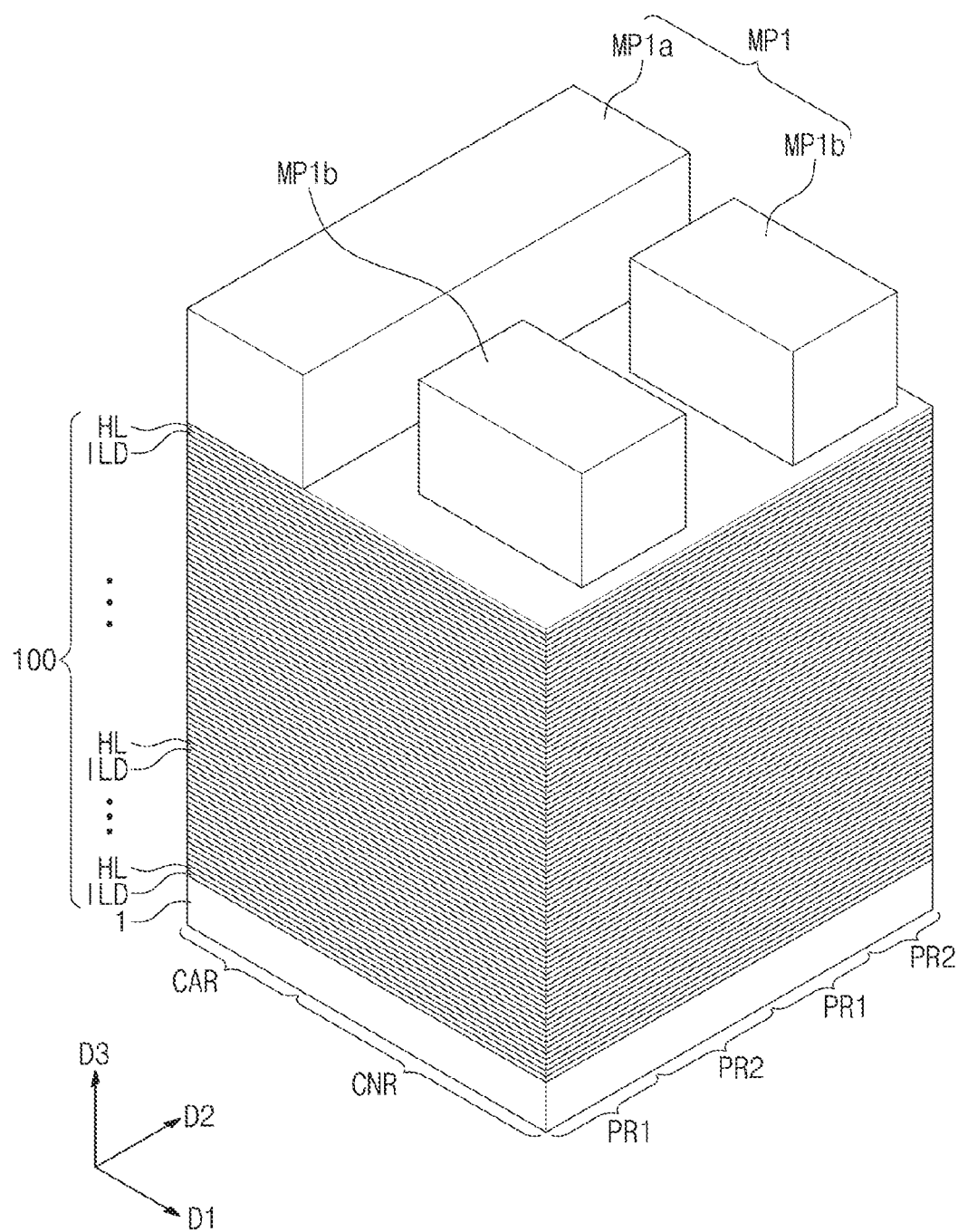
FIGS. 13 to 17 are perspective views illustrating a method of manufacturing an electrode structure of a 3D semiconductor memory device according to one or more example embodiments.

Referring to FIGS. 12 and 13, a thin-layer structure 100 may be formed on a substrate 1 including a cell array region CAR and a connection region CNR (S10).

The connection region CNR may be adjacent to the cell array region CAR in a first direction D1. The connection region CNR may include a first pad region PR1 and a second pad region PR2 which are adjacent to each other in a second direction D2 intersecting the first direction D1.

The thin-layer structure 100 may include horizontal layers HL and insulating layers ILD which are vertically alternately stacked on the substrate 1. In other words, the horizontal layers HL and the insulating layers ILD may be alternately stacked in a third direction D3.

The horizontal layers HL may be formed of a material having an etch selectivity with respect to the insulating layers ILD. For example, each of the insulating layers ILD may be a silicon oxide layer, and each of the horizontal layers HL may include at least one of a silicon nitride layer, a silicon oxynitride layer, a poly-crystalline silicon layer, or a metal layer.

Figure 14:
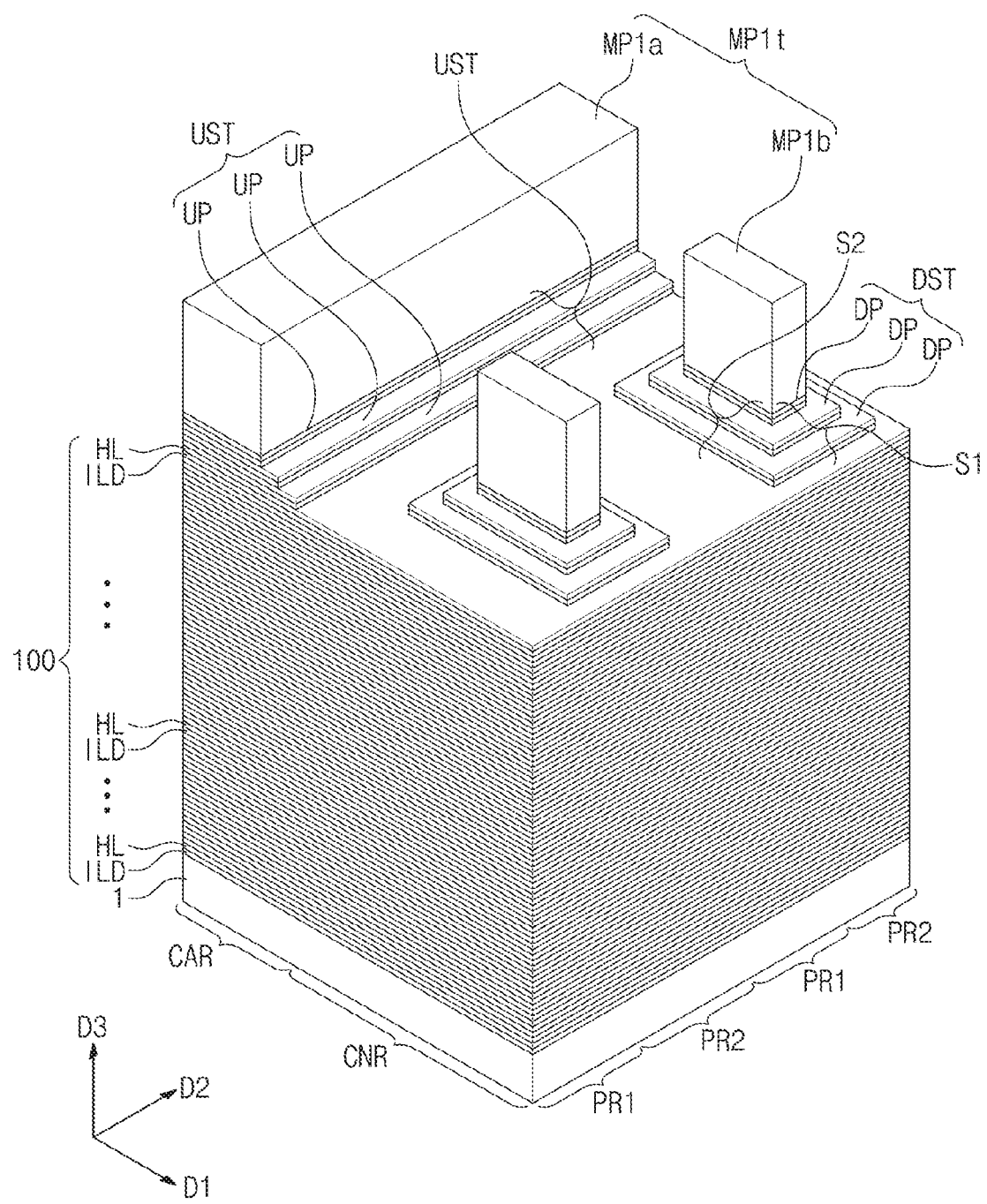

Referring to FIGS. 12, 13 and 14, a dummy structure DST having single-layered stairs along the first and second directions D1 and D2 may be formed by repeatedly performing a single-layer etching process on a portion of the thin-layer structure 100 on the first and second pad regions PR1 and PR2 (S20).

In detail, the formation of the dummy structure DST may include forming a first mask pattern MP1 on the thin-layer structure 100, performing the single-layer etching process etching a portion of the thin-layer structure 100 by using the first mask pattern MP1 as an etch mask, and performing a first trimming process reducing an area of the first mask pattern MP1. Here, the single-layer etching process and the first trimming process may be alternately repeated at least one more time.

The first mask pattern MP1 may expose a portion of the thin-layer structure 100 on the connection region CNR, as illustrated in FIG. 13. In one or more example embodiments, the first mask pattern MP1 may include a first portion MP1*a* and second portions MP1*b*. The first portion MP1*a* may cover the cell array region CAR. The second portions MP1*b* may be spaced apart from the first portion MP1*a* and may cover portions of the connection region CNR, respectively. The second portions MP1*b* may have island shapes on the thin-layer structure 100 and may be spaced apart from each other in the second direction D2. In one or more example embodiments, a width and a space of the second portions MP1*b* of the first mask pattern MP1 may correspond to a vertical pitch and a horizontal pitch of the pad portions of the electrode structure ST described above. For example, the formation of the first mask pattern MP1 may include coating an entire top surface of the thin-layer structure 100 with a first photoresist layer and performing an exposure process and a development process on the first photoresist layer.

The single-layer etching process may etch the thin-layer structure 100 by a first etching depth corresponding to the vertical pitch of the horizontal layers HL. Here, the vertical pitch of the horizontal layers HL may indicate a vertical distance between top surfaces of the horizontal layers HL adjacent to each other in the third direction D3.

The single-layer etching process may be performed once to etch one horizontal layer HL and one insulating layer ILD, and thus dummy patterns DP may be formed on the connection region CNR and an upper pattern UP may be formed on the cell array region CAR. The upper pattern UP may be spaced apart from the dummy patterns DP, and the dummy patterns DP located at the same level from the substrate 1 may be spaced apart from each other in the second direction D2.

The first trimming process may expand a region exposed by the first mask pattern MP1, and thus portions of the upper pattern UP and the dummy patterns DP formed in the previous process may be exposed. The first trimming process may be performed by, for example, an isotropic dry etching method or a wet etching method.

Because an entire surface of the first mask pattern MP1 is etched during the first trimming process, a top surface of the first mask pattern MP1 may be recessed. In other words, the area and a thickness of the first mask pattern MP1 may be reduced by the first trimming process. In more detail, the first trimming process may laterally move sidewalls of the first and second portions MP1*a* and MP1*b* of the first mask pattern MP1 in the first direction D1 and the second direction D2 by a predetermined distance. Here, the lateral distance of the sidewalls of the first mask pattern MP1 may correspond to a width of the pad portion of each of the electrodes EL of the electrode structure ST.

After the first trimming process is performed once, the single-layer etching process may be performed using the trimmed first mask pattern MP1*t*, and then, the first trimming process and the single-layer etching process may be alternately and repeatedly performed. The number of repetitions of the single-layer etching process and the first trimming process may be changed depending on the number of the horizontal layers HL stacked on the substrate 1. For example, the number of repetitions of the single-layer etching process and the first trimming process may be changed according to the number of the electrodes EL constituting the middle structure MST described above. For example, when the number of the electrodes EL of each of the middle structures MST is 2n where 'n' is a natural number of 1 or more, the first trimming processes may be performed n−1 times.

Because the single-layer etching process and the first trimming process are repeated, an upper structure UST and a dummy structure DST may be formed on the thin-layer structure 100.

In one or more example embodiments, the upper structure UST may include the upper patterns UP vertically stacked. In detail, the upper patterns UP may cover the cell array region CAR and may be stacked to have an upper staircase structure formed along the first direction D1 on the connection region CNR. Lengths of the upper patterns UP in the first direction D1 may decrease sequentially as a vertical distance from the substrate 1 increases. End portions of the upper patterns UP may be exposed on the connection region CNR. Horizontal distances, each of which corresponds to a horizontal distance between sidewalls of the upper patterns UP vertically adjacent to each other, may be substantially equal to each other. Thus, the upper structure UST may have the upper staircase structure formed along the first direction D1, and the upper staircase structure may consist of single-layered stairs. In the upper staircase structure, a height of each of the single-layered stairs may correspond to the vertical pitch of the horizontal layers HL. In one or more example embodiments, the single-layered stair may include one horizontal layer HL, and a multi-layered stair may include two or more horizontal layers HL.

The dummy structure DST may include the dummy patterns DP vertically stacked. The dummy structure DST may be formed on the first and second pad regions PR1 and PR2. The dummy patterns DP may have lengths in the first direction D1 and widths in the second direction D2. In the dummy structure DST, the lengths and the widths of the dummy patterns DP may decrease sequentially as a vertical distance from the substrate 1 increases. In one or more example embodiments, a horizontal distance between first sidewalls of the dummy patterns DP in the first direction D1 may be substantially equal to a horizontal distance between second sidewalls of the dummy patterns DP in the second direction D2. The length, in the first direction D1, of each of the dummy patterns DP may be greater than the width, in the second direction D2, of each of the dummy patterns DP.

The dummy structure DST may have a substantially pyramidal shape. Thus, the dummy structure DST may have first staircase structures S1 formed in the first direction D1 and second staircase structures S2 formed in the second direction D2 on the connection region CNR. Each of the first and second staircase structures S1 and S2 may consist of single-layered stairs. A height of each of the single-layered stairs of the first and second staircase structures S1 and S2 may correspond to the vertical pitch of the horizontal layers HL. In the dummy structure DST, the first staircase structures S1 may be symmetrical with respect to an imaginary line parallel to the second direction D2 and the second staircase structures S2 may be symmetrical with respect to an imaginary line parallel to the first direction D1. The second staircase structures S2 of the dummy structure DST may be provided on the first and second pad regions PR1 and PR2, respectively.

The trimmed first mask pattern MP1t may be removed after the formation of the upper structure UST and the dummy structure DST.

Figure 15:
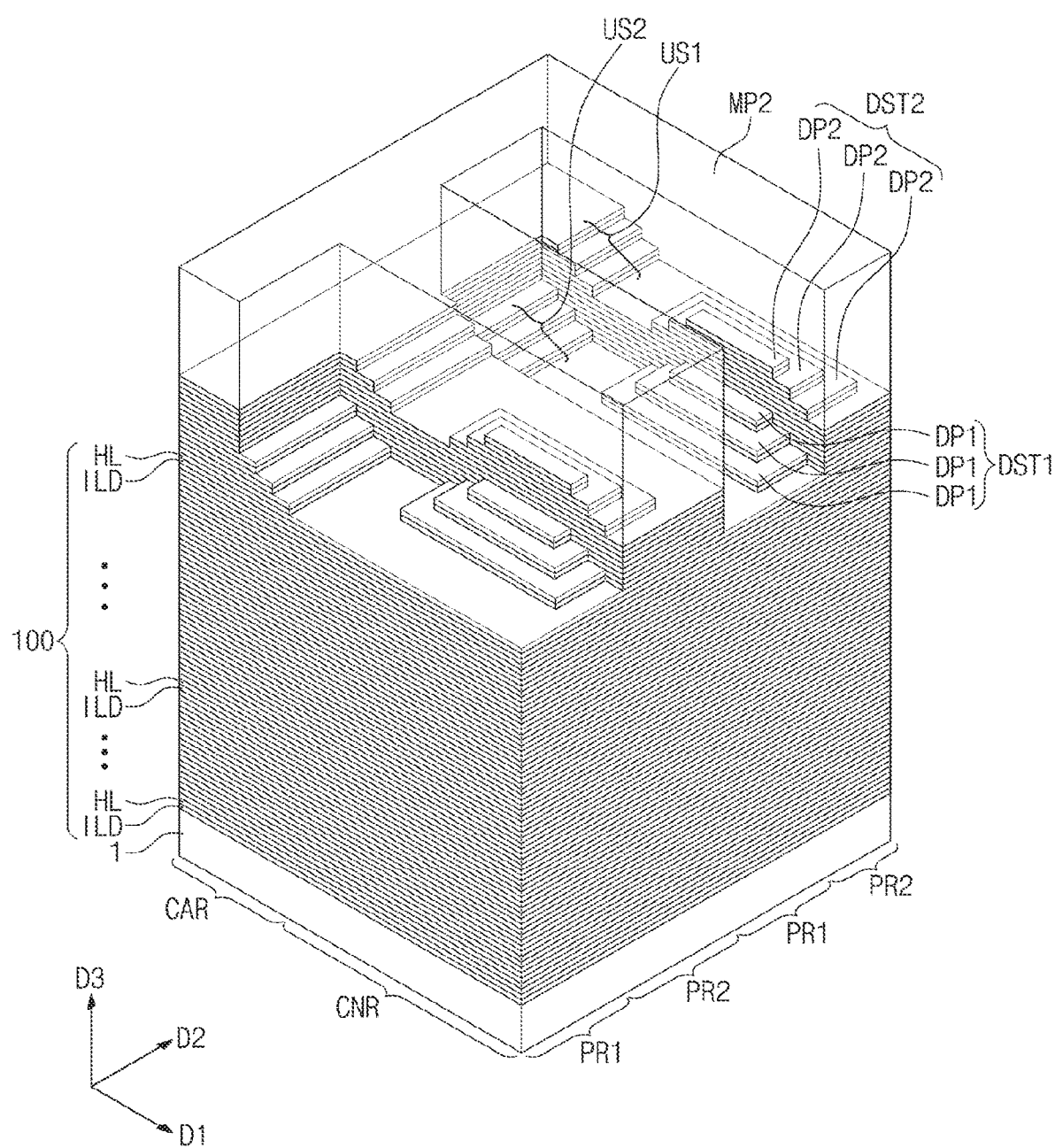

Referring to FIGS. 12 and 15, first and second dummy structures DST1 and DST2 may be formed by performing a first multi-layer etching process on a portion of the dummy structure DST and a portion of the thin-layer structure 100 on the first pad region PR1 (S30).

In detail, the formation of the first and second dummy structures DST1 and DST2 may include forming a second mask pattern MP2 exposing the first pad region PR1, and etching a portion of the dummy structure DST and a portion of the thin-layer structure 100 by using the second mask pattern MP2 as an etch mask.

Here, the second mask pattern MP2 may cover the cell array region CAR and the second pad region PR2 and may have an opening exposing the first pad region PR1. The opening of the second mask pattern MP2 may intersect the dummy structure DST in the first direction D1 and may expose portions of the first and second staircase structures of the dummy structure DST and a portion of the upper staircase structure of the upper structure UST. In one or more example embodiments, the formation of the second mask pattern MP2 may include forming a second photoresist layer fully covering the substrate 1 and performing an exposure process and a development process on the second photoresist layer.

In one or more example embodiments, the first multi-layer etching process may include etching at least two or more horizontal layers HL. An etching depth in the first multi-layer etching process may be changed depending on the number of the electrodes EL constituting the middle structure MST. For example, when the number of the electrodes EL of each of the middle structures MST is 2n where 'n' is a natural number of 1 or more, the number of the horizontal layers HL etched in the first multi-layer etching process may be n. For example, four horizontal layers HL may be etched in the first multi-layer etching process.

Because the first multi-layer etching process is performed, portions of the first and second staircase structures of the dummy structure DST on the first pad region PR1 may be transferred to a portion of the thin-layer structure 100 thereunder. Thus, the first dummy structure DST1 may be formed on the first pad region PR1. The first dummy structure DST1 may include first dummy patterns DP1 vertically stacked. The first dummy structure DST1 may have a first dummy staircase structure formed in both the first direction D1 and the second direction D2 on the first pad region PR1. Here, the first dummy staircase structure may consist of single-layered stairs.

In the first multi-layer etching process, a portion of the dummy structure DST may locally remain on the second pad region PR2 to form the second dummy structure DST2. In one or more example embodiments, a level difference between the second dummy structure DST2 and the first dummy structure DST1 may be generated by the first multi-layer etching process. A level difference between a top surface of the first dummy structure DST1 and a top surface of the second dummy structure DST2 may correspond to the etching depth in the first multi-layer etching process.

The second dummy structure DST2 may include second dummy patterns DP2 vertically stacked. Here, the second dummy patterns DP2 may have sidewalls vertically aligned with each other, and the second dummy structure DST2 may have a second dummy staircase structure formed in the first direction D1 and the second direction D2 by the second dummy patterns DP2. The second dummy staircase structure may consist of single-layered stairs.

Figure 16:
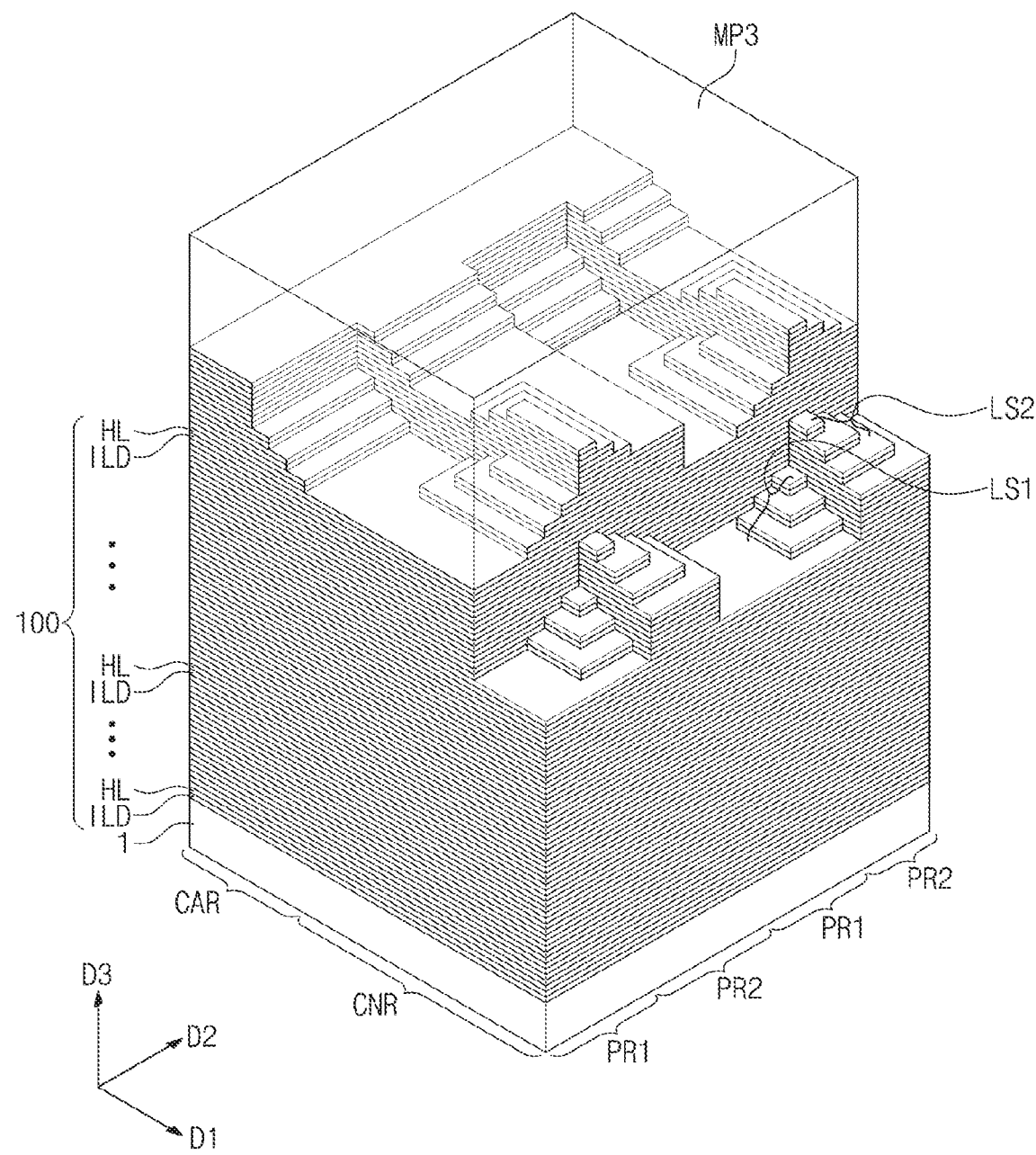
Figure 17:
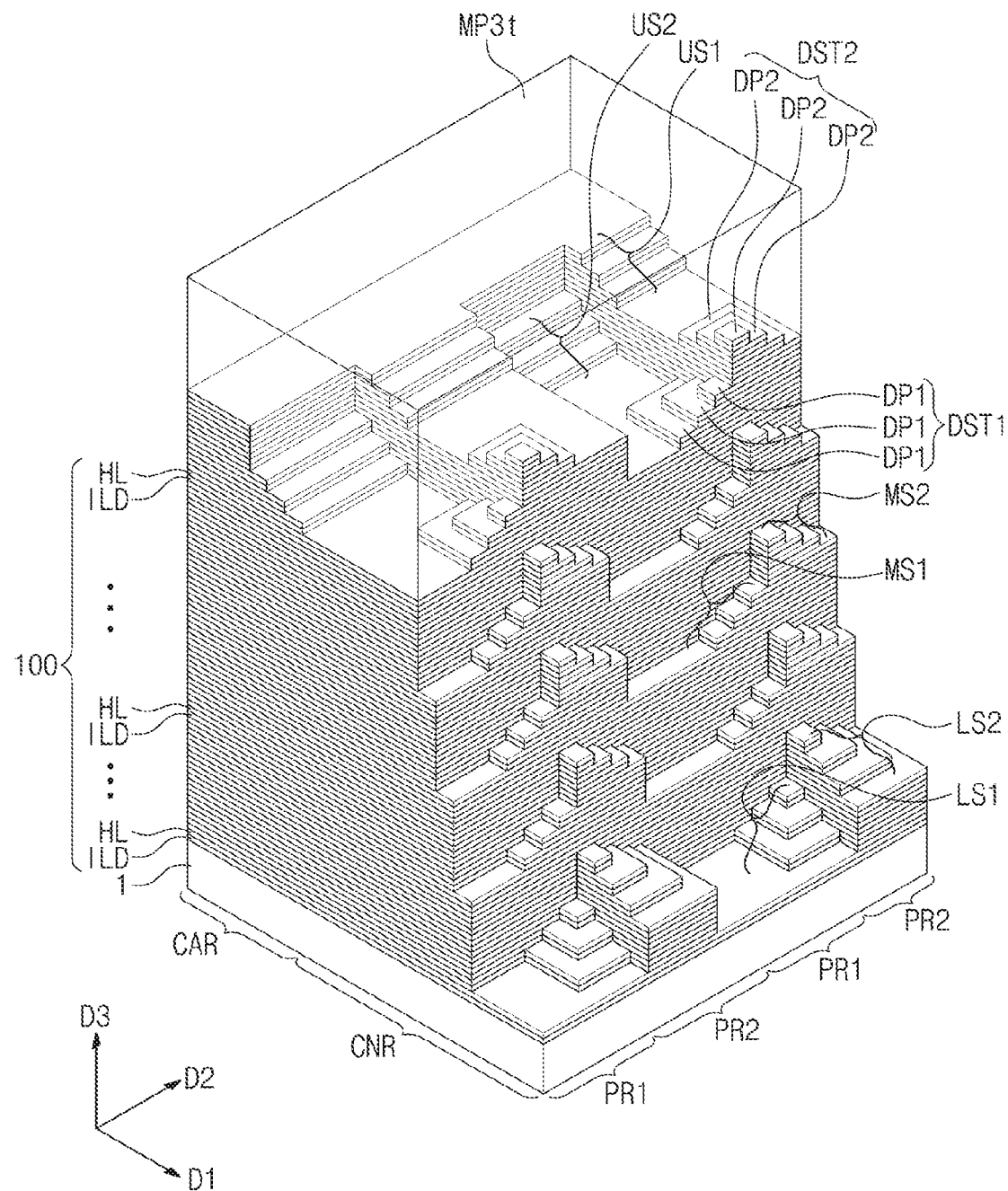

Referring to FIGS. 12, 16 and 17, an electrode structure ST may be formed by repeatedly performing a second multi-layer etching process on portions of the first and second dummy structures DST1 and DST2 and a portion of the thin-layer structure 100 on the first and second pad regions PR1 and PR2 (S40).

In detail, the formation of the electrode structure ST may include forming a third mask pattern MP3 exposing portions of the first and second dummy structures DST1 and DST2, performing the second multi-layer etching process etching portions of the first and second dummy structures DST1 and DST2 and a portion of the thin-layer structure 100 by using the third mask pattern MP3 as an etch mask, and performing a second trimming process reducing an area of the third mask pattern MP3. Here, the second multi-layer etching process and the second trimming process may be alternately repeated at least one or more times.

Referring to FIG. 16, the third mask pattern MP3 may expose the portions of the first and second dummy structures DST1 and DST2 and a portion of the thin-layer structure 100. In the first and second dummy structures DST1 and DST2, portions of first staircase structures formed in the first direction D1 and portions of second staircase structures formed in the second direction D2 may be exposed by the third mask pattern MP3. For example, the formation of the third mask pattern MP3 may include forming a third photoresist layer on an entire top surface of the substrate 1, and performing an exposure process and a development process on the third photoresist layer.

Subsequently, the second multi-layer etching process may be performed using the third mask pattern MP3 as an etch mask to etch the first and second dummy structures DST1 and DST2 and the thin-layer structure 100 by a second etching depth. The second etching depth of the second multi-layer etching process may be equal to or greater than twice the vertical pitch of the horizontal layers HL. In other words, portions of at least two or more first dummy patterns DP1, portions of at least two or more second dummy patterns DP2 and portions of at least two or more horizontal layers HL may be etched by the second multi-layer etching process.

The second etching depth in the second multi-layer etching process may be changed depending on the number of the electrodes EL constituting the middle structure MST. For example, when the number of the electrodes EL of each of the middle structures MST is 2n where 'n' is a natural number of 1 or more, the number of the horizontal layers HL etched in the second multi-layer etching process may be 2n. For example, eight horizontal layers HL may be etched in the second multi-layer etching process.

The second multi-layer etching process may be performed to etch end portions of the first and second dummy structures DST1 and DST2, and thus lengths of the first and second dummy structures DST1 and DST2 in the first direction D1 may be equally reduced. Therefore, in the first and second dummy structures DST1 and DST2, the first dummy patterns DP1 may have sidewalls vertically aligned with each other, and the second dummy patterns DP2 may also have sidewalls vertically aligned with each other.

In addition, by the second multi-layer etching process, a portion of the first dummy staircase structure of the first dummy structure DST1 may be transferred to a portion of the thin-layer structure 100 on the first pad region PR1 and a portion of the second dummy staircase structure of the second dummy structure DST2 may be transferred to another portion of the thin-layer structure 100 on the second pad region PR2. Thus, a lower structure having a staircase structure in the first direction D1 and the second direction D2 may be formed.

The lower structure may include first and second lower staircase structures LS1 and LS2, each of which is formed in both the first direction D1 and the second direction D2.

The first lower staircase structure LS1 may be formed along the first direction D1 and the second direction D2 on the first pad region PR1, and the second lower staircase structure LS2 may be formed along the first direction D1 and the second direction D2 on the second pad region PR2.

Referring to FIG. 17, after the second multi-layer etching process, the second trimming process may be performed on the third mask pattern MP3 to form trimmed third mask pattern MP3t. The second trimming process may expand a region exposed by the third mask pattern MP3, and thus portions of the first and second dummy structures DST1 and DST2 and the lower structure formed in the previous process may be exposed. In other words, the trimmed third mask pattern MP3t may expose portions of the first and second dummy staircase structures of the first and second dummy structures DST1 and DST2.

The second trimming process may laterally shift or move a sidewall of the third mask pattern MP3 in the first direction D1 by a predetermined distance, and thus the area of the trimmed third mask pattern MP3t may cover less than the third mask pattern MP3. Here, the lateral movement distance of the sidewall of the third mask pattern MP3 may correspond to a difference between the lengths, in the first direction D1, of the middle structures MST described above. The second trimming process may be performed by, for example, an isotropic dry etching method or a wet etching method. In addition, because an entire surface of the third mask pattern MP3 is etched during the second trimming process, a top surface of the trimmed third mask pattern MP3t may be recessed. In other words, the area and a thickness of the third mask pattern MP3 may be reduced by the second trimming process.

The second multi-layer etching process may be performed using the trimmed third mask pattern MP3t as an etch mask to etch portions of the first and second dummy structures DST1 and DST2 and the lower structure. Thus, as illustrated in FIG. 17, a middle structure to which portions of the first and second dummy staircase structures formed along the second direction D2 in the first and second dummy structures DST1 and DST2 are transferred may be formed, and a lower structure may be formed below the middle structure.

The middle structure may have first and second middle staircase structures MS1 and MS2 which are formed along the second direction D2 and are located at different levels from each other. Sidewalls of the horizontal layers HL etched by the second multi-layer etching process may be aligned with each other. End portions of the horizontal layers HL of the lower structure may constitute first and second lower staircase structures, each of which is formed along the first direction D1 and the second direction D2.

Subsequently, the second trimming process and the second multi-layer etching process may be alternately and repeatedly performed. The number of the repetition of the second multi-layer etching process and the second trimming process may be changed depending on the number of the horizontal layers HL stacked on the substrate 1. For example, the number of the repetition of the second multi-layer etching process and the second trimming process may correspond to the number of the middle structures MST of the electrode structure ST described above.

In the aforementioned example embodiments, the second multi-layer etching process is performed after the first multi-layer etching process. However, example embodiments are not limited thereto. In certain example embodiments, the second multi-layer etching process may be performed before the first multi-layer etching process.

FIGS. 18A, 19A, 20A, and 21A are plan views illustrating a method of manufacturing an electrode structure of a 3D semiconductor memory device according to one or more example embodiments. FIGS. 18B, 19B, 20B and 21B are perspective views illustrating a method of manufacturing an electrode structure of a 3D semiconductor memory device according to one or more example embodiments. Hereinafter, the descriptions of the same technical features as in the above example embodiments will be omitted or mentioned briefly for the purpose of ease and convenience in explanation.

Figure 18B:
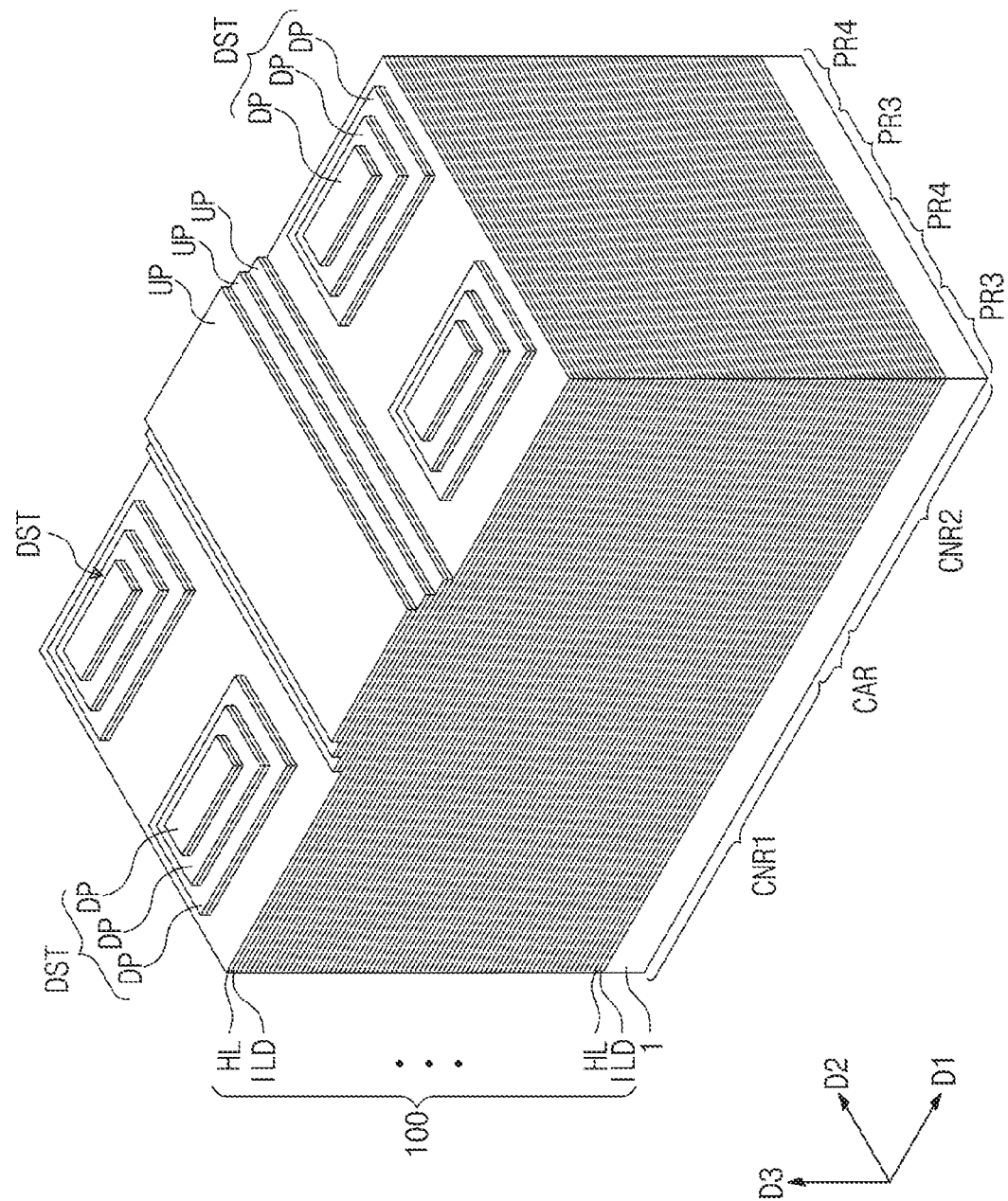

Referring to FIGS. 18A and 18B, a substrate 1 may include first and second connection regions CNR1 and CNR2 spaced apart from each other in the first direction D1 and a cell array region CAR disposed between the first and second connection regions CNR1 and CNR2. The first connection region CNR1 may include first and second pad regions PR1 and PR2 alternately arranged in the second direction D2, and the second connection region CNR2 may include third and fourth pad regions PR3 and PR4 alternately arranged in the second direction D2.

A thin-layer structure 100 may be formed on the substrate 1, and then, a single-layer etching process may be repeatedly performed on portions of the thin-layer structure 100 on the first and second connection regions CNR1 and CNR2, as described with reference to FIGS. 13 and 14. The dummy structures DST may be formed on the first and second connection regions CNR1 and CNR2, respectively.

As described above, a first mask pattern which includes a first portion covering the cell array region CAR and second portions having island shapes on the first and second connection regions CNR1 and CNR2 may be used as an etch mask in the single-layer etching process.

The dummy structures DST of the first and second connection regions CNR1 and CNR2 may be disposed or located at the same level from the substrate 1. The dummy structure DST on each of the first and second connection regions CNR1 and CNR2 may have substantially the same features as described with reference to FIG. 14.

Figure 19B:
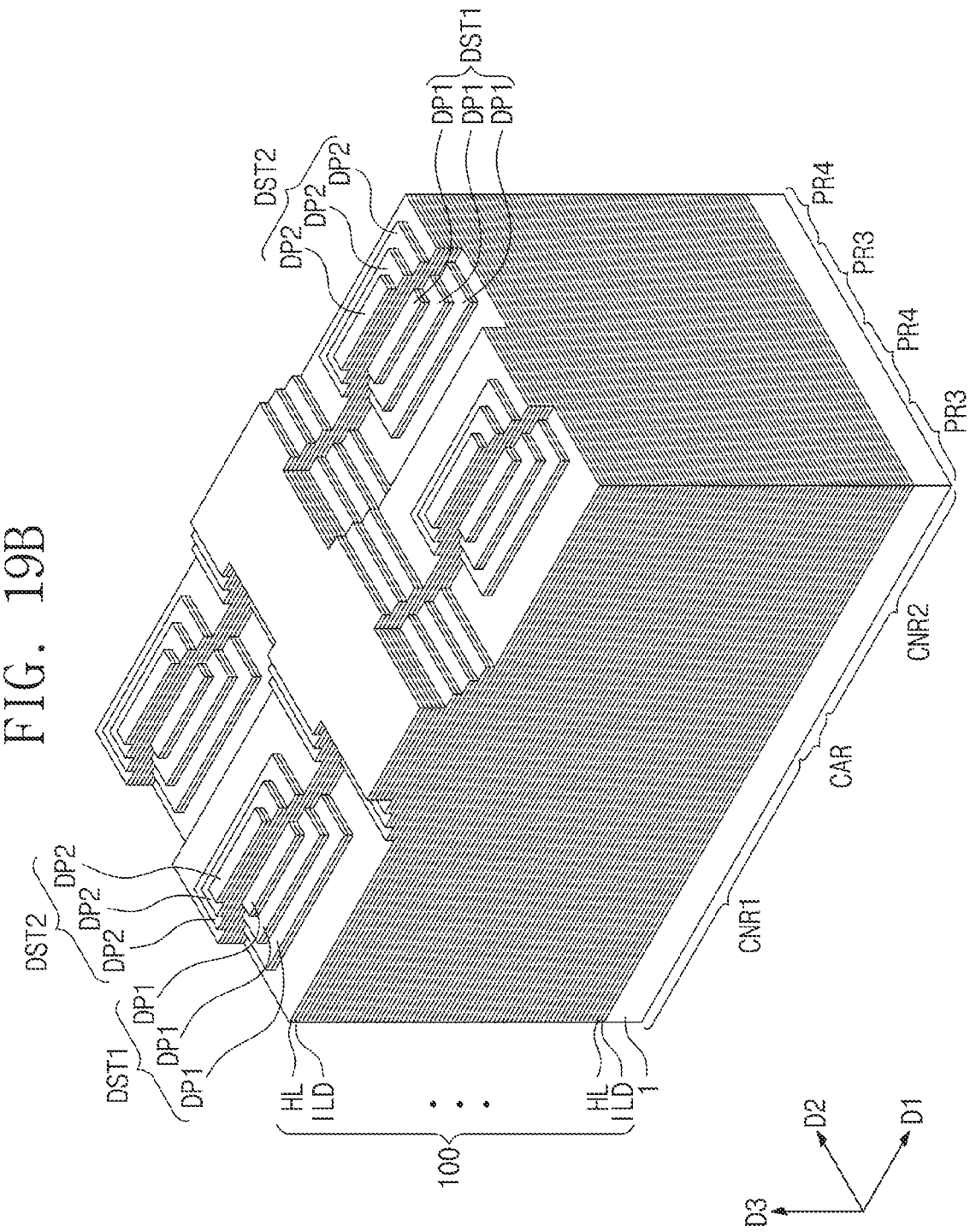

Referring to FIGS. 19A and 19B, after the formation of the dummy structures DST, a first multi-layer etching process may be performed on portions of the dummy structures DST and portions of the thin-layer structure 100 on the first and third pad regions PR1 and PR3, as described with reference to FIG. 15.

In detail, a portion of the dummy structure DST on the first pad region PR1 may be etched, and a portion of the dummy structure DST on the third pad region PR3 may be etched. A second mask pattern having openings exposing the first and third pad regions PR1 and PR3 may be used as an etch mask in the first multi-layer etching process. Here, the second mask pattern may be similar to the second mask pattern MP2 described above with reference to FIG. 15.

When the number of the electrodes EL of each of the middle structures MST is 2n where 'n' is a natural number of 1 or more, the number of the horizontal layers HL etched in the first multi-layer etching process may be n. For example, four horizontal layers HL may be etched in the first multi-layer etching process.

Because the first multi-layer etching process is performed, a first dummy structure DST1 may be formed on each of the first and third pad regions PR1 and PR3 and a second dummy structure DST2 may be formed on each of the second and fourth pad regions PR2 and PR4. As described above, the first and second dummy structures DST1 and DST2 may be located at different levels. The first dummy structure DST1 on the first pad region PR1 may be located at the same level as the first dummy structure DST1 on the third pad region PR3. The second dummy structure DST2 on the second pad region PR2 may be located at the same level as the second dummy structure DST2 on the fourth pad region PR4.

Figure 20A:
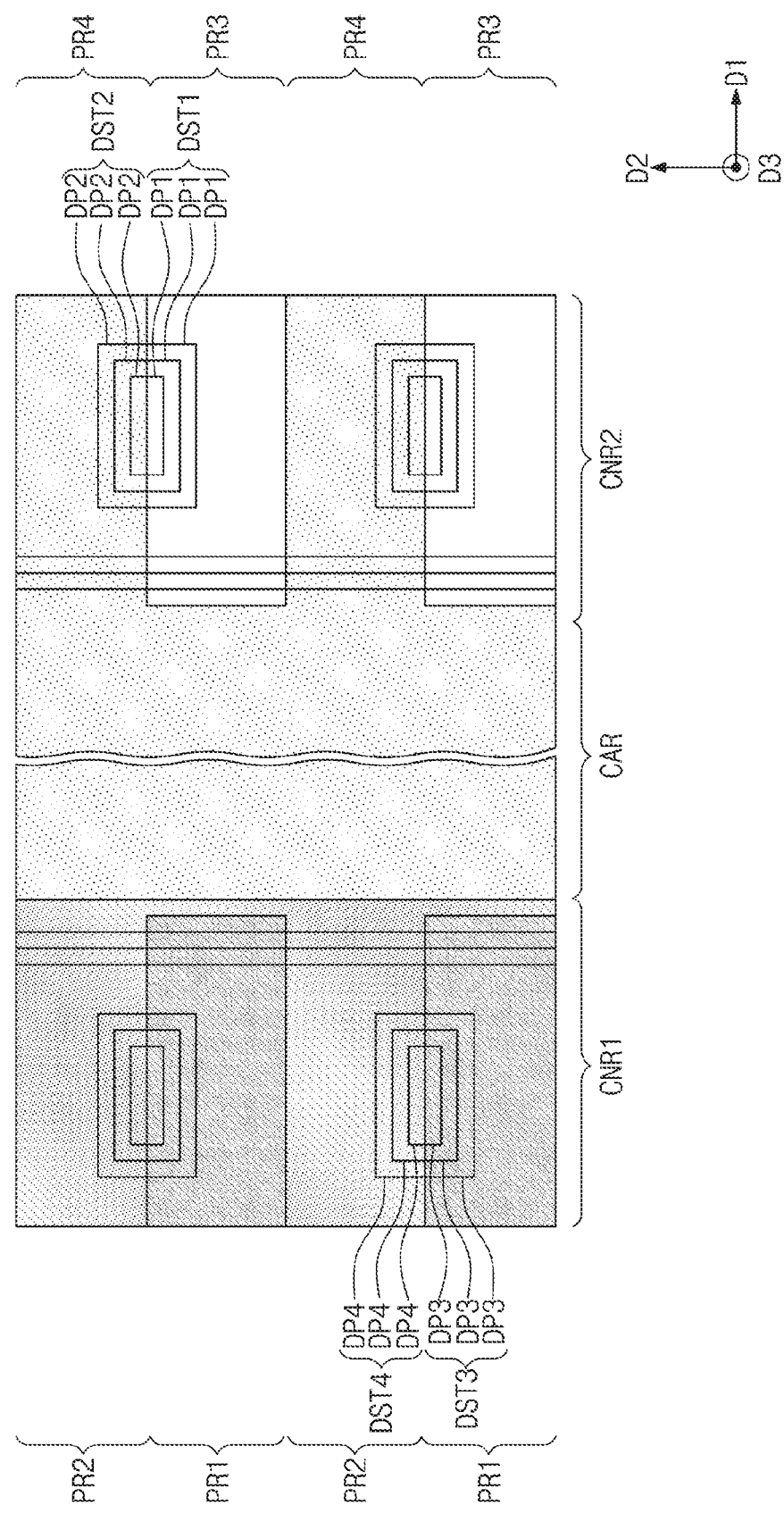
Figure 20B:
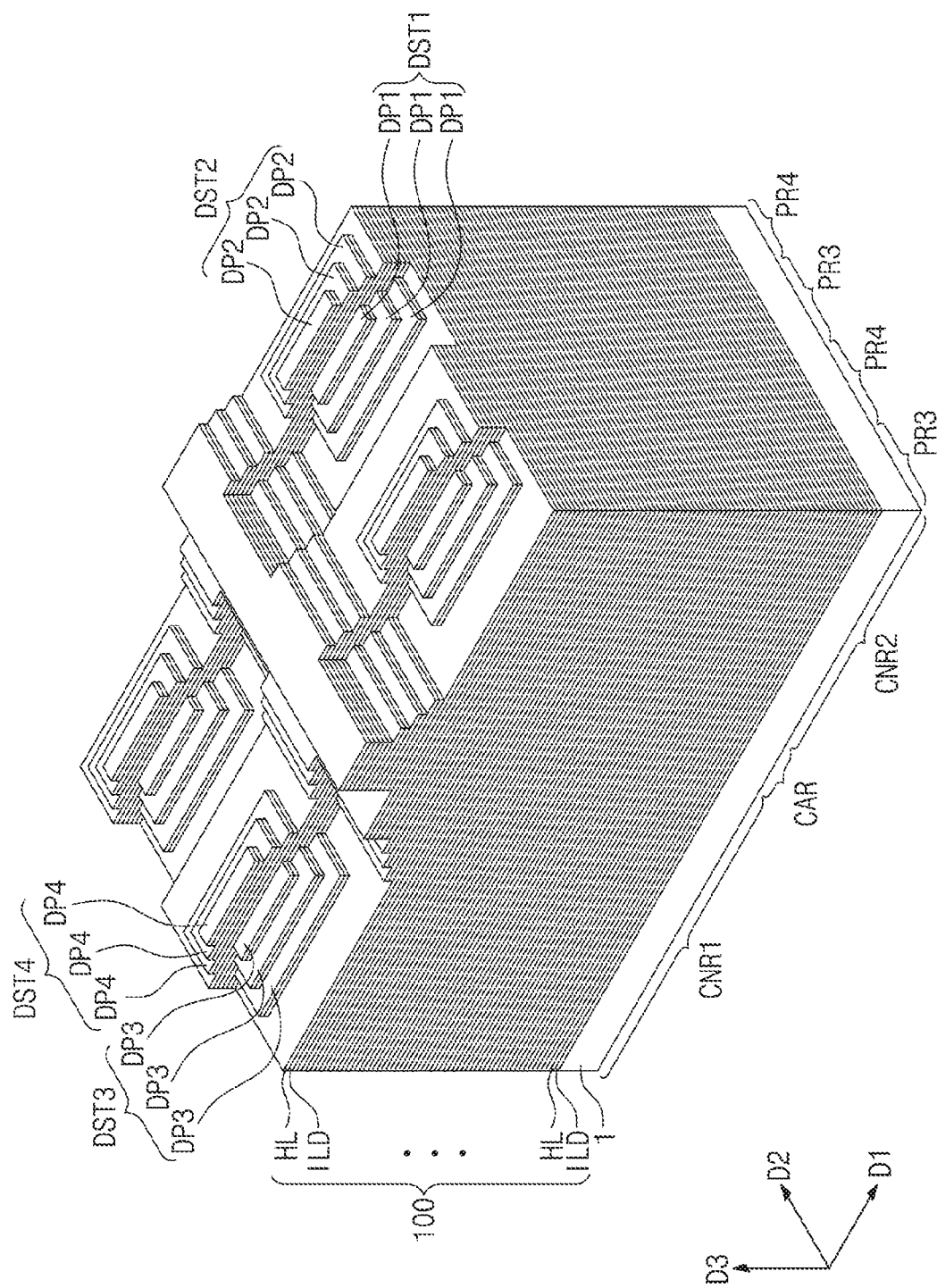

Referring to FIGS. 20A and 20B, a selective etching process may be performed on the first and second dummy structures DST1 and DST2 and a portion of the thin-layer structure 100 on the first connection region CNR1.

A mask pattern which covers the cell array region CAR and the second connection region CNR2 and exposes the first connection region CNR1 may be used as an etch mask in the selective etching process.

By the selective etching process, a third dummy structure DST3 may be formed on the first pad region PR1 of the first connection region CNR1 and a fourth dummy structure DST4 may be formed on the second pad region PR2 of the first connection region CNR1.

The third dummy structure DST3 may be located at a lower level than the fourth dummy structure DST4, and the fourth dummy structure DST4 may be located at a lower level than the first dummy structure DST1. In other words, the first dummy structure DST1 on the second connection region CNR2 may be located at a first level from the substrate 1, and the second dummy structure DST2 may be located at a second level higher than the first level on the second connection region CNR2. The third dummy structure DST3 may be located at a third level lower than the first level on the first connection region CNR1. In addition, the fourth dummy structure DST4 may be located at a fourth level higher than the third level and lower than the first level on the first connection region CNR1.

Figure 21A:
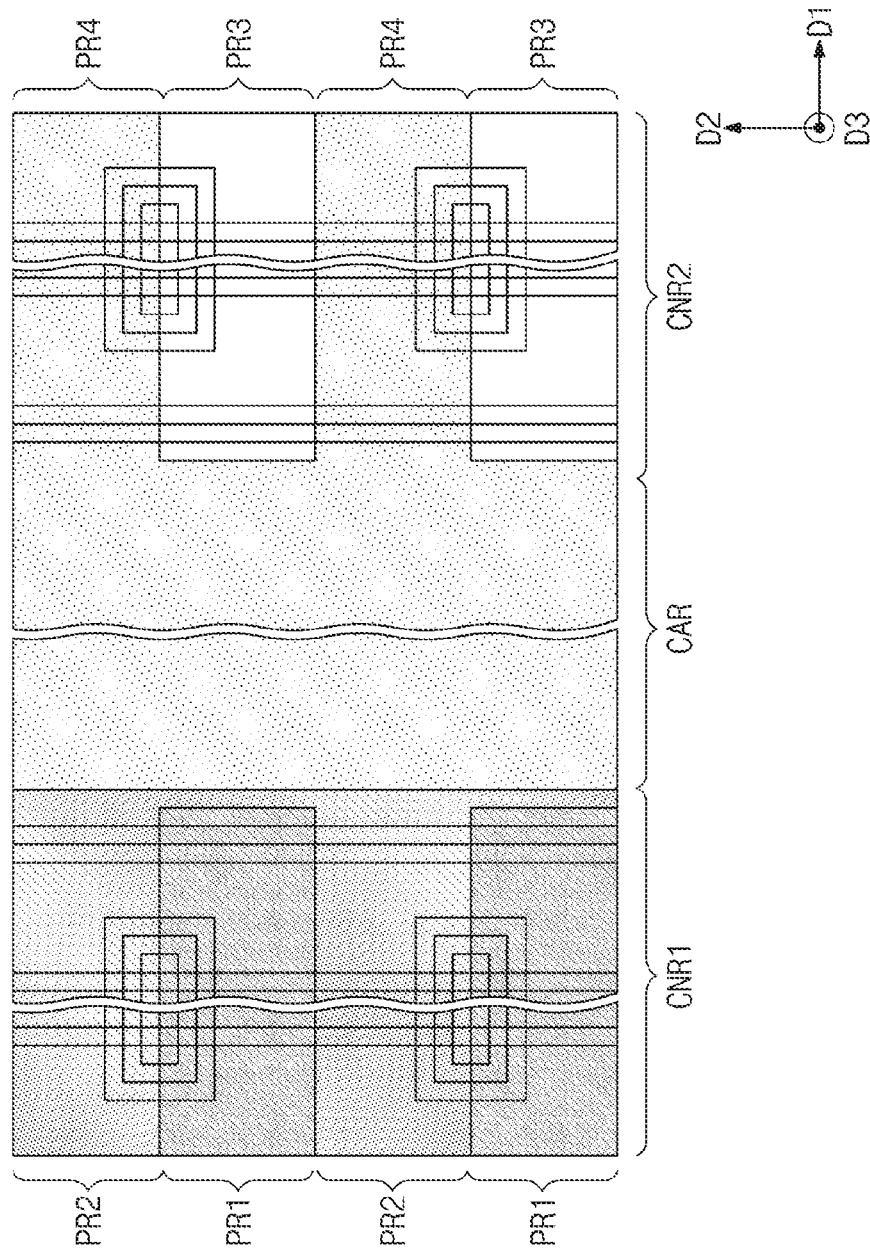

Referring to FIGS. 21A and 21B, after the formation of the first to fourth dummy structures DST1, DST2, DST3 and DST4, a second multi-layer etching process may be repeatedly performed to form an electrode structure ST, as described above with reference to FIGS. 16 and 17.

The second multi-layer etching process may be performed on portions of the first to fourth dummy structures DST1, DST2, DST3 and DST4 and a portion of the thin-layer structure 100. The third mask pattern described above with reference to FIGS. 16 and 17 may be used as an etch mask in the second multi-layer etching process, and a trimming process may be performed on the third mask pattern after the second multi-layer etching process.

Because the second multi-layer etching process is performed, end portions of the first and second dummy structures DST1 and DST2 and a portion of the thin-layer structure 100 thereunder may be etched on the second connection region CNR2. In addition, end portions of the third and fourth dummy structures DST3 and DST4 and a portion of the thin-layer structure 100 thereunder may be etched on the first connection region CNR1.

Because the second multi-layer etching process is repeatedly performed, lengths of the first and second dummy structures DST1 and DST2 in the first direction D1 may be equally reduced and lengths of the third and fourth dummy structures DST3 and DST4 in the first direction D1 may be equally reduced.

According to the example embodiments, the dummy structure having the pyramidal staircase structure may be formed on the connection region, and then, the first and second dummy structures located at different levels may be formed using a portion of the dummy structure as an etch mask. The vertically stacked horizontal layers may be patterned using the first and second dummy structures, and thus the number of processes may be reduced in forming the staircase structure of the electrode structure on the connection region and a planar area of the staircase structure may be reduced. Thus, the integration density of the 3D semiconductor memory device may be increased.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. As used herein, the term "and/or" includes any and all combinations of one or more of the associated listed items.

While example embodiments have been described, it will be apparent to those skilled in the art that various changes and modifications may be made without departing from the spirits and scopes of the present disclosure. Therefore, it should be understood that the above example embodiments are not limiting, but illustrative.

What is claimed is:

1. A three-dimensional (3D) semiconductor memory device comprising:
    a substrate comprising a cell array region and a connection region adjacent to the cell array region in a first direction, the connection region comprising a first pad region and a second pad region adjacent to each other in a second direction, the second direction intersecting the first direction;
    an electrode structure comprising a plurality of electrodes vertically stacked on the substrate, the electrode structure comprising a first upper portion forming a first upper staircase structure along the first direction on the connection region and a second upper portion forming a second upper staircase structure along the first direction on the connection region;
    a first dummy structure laterally spaced apart from the first upper portion of the electrode structure and provided on the first pad region; and
    a second dummy structure laterally spaced apart from the second upper portion of the electrode structure and provided on the second pad region,
    wherein each of the first dummy structure and the second dummy structure comprises a dummy staircase structure formed along the first direction and the second direction,
    wherein the first upper portion is located at a first level from the substrate, and the second upper portion is located at a second level from the substrate, the second level being higher than the first level, and
    wherein the first dummy structure is located at the first level from the substrate, and the second dummy structure is located at the second level from the substrate.

2. The 3D semiconductor memory device of claim 1, wherein the electrode structure has a first width in the second direction on the cell array region, and
    wherein each of the first dummy structure and the second dummy structure has a second width in the second direction, the second width being less than half of the first width.

3. The 3D semiconductor memory device of claim 1, wherein the dummy staircase structure of the first dummy structure and the dummy staircase structure of the second dummy structure face away from each other.

4. The 3D semiconductor memory device of claim 1, wherein each of the first dummy structure and the second dummy structure comprises a plurality of dummy patterns vertically stacked, and one sidewall of each of the plurality of dummy patterns is vertically aligned.

5. The 3D semiconductor memory device of claim 1, wherein the electrode structure comprises:
    a first lower staircase structure, a first middle staircase structure, and the first upper staircase structure, which are formed along the first direction on the first pad region; and
    a second lower staircase structure, a second middle staircase structure, and the second upper staircase structure, which are formed along the first direction on the second pad region,
    wherein the first lower, middle and upper staircase structures are located levels different from the second lower, middle and upper staircase structures.

6. The 3D semiconductor memory device of claim 5, wherein the first lower staircase structure and the second lower staircase structure comprise single-layered stairs formed in both the first direction and the second direction.

7. The 3D semiconductor memory device of claim 5, wherein the first middle staircase structure and the second middle staircase structure comprise multi-layered stairs formed in the first direction and single-layered stairs formed in the second direction.

8. The 3D semiconductor memory device of claim 7, wherein a height of each of the multi-layered stairs is greater than a level difference between the first level and the second level.

9. A three-dimensional (3D) semiconductor memory device comprising:
    a substrate comprising a cell array region, a first connection region and a second connection region spaced apart from each other in a first direction, the cell array region being interposed between the first connection region and the second connection region, the first connection region comprising a first pad region and a second pad region arranged in a second direction, the second direction intersecting the first direction, and the second connection region comprising a third pad region and a fourth pad region arranged in the second direction;
    an electrode structure comprising a plurality of electrodes vertically stacked on the substrate; and
    a plurality of dummy structures, the plurality of dummy structures comprising a first dummy structure disposed on the first pad region, a second dummy structure disposed on the second pad region, a third dummy structure disposed on the third pad region and a fourth dummy structure disposed on the fourth pad region, wherein each of the plurality of dummy structures comprises dummy patterns vertically stacked on the electrode structure,
    wherein uppermost surfaces of the first, second, third, and fourth dummy structures are located at different levels from the substrate.

10. The 3D semiconductor memory device of claim 9, wherein each of the plurality of dummy structures comprises a dummy staircase structure formed along both the first direction and the second direction.

11. The 3D semiconductor memory device of claim 10, wherein the electrode structure has a first width in the second direction, and
    wherein each of the plurality of dummy structures has a second width in the second direction, the second width being less than half of the first width.

12. The 3D semiconductor memory device of claim 9, wherein a lower portion of the electrode structure is adjacent a top surface of the substrate and comprises a lower staircase structure comprising single-layered stairs formed along both the first direction and the second direction,
    wherein a middle portion of the electrode structure comprises a middle staircase structure comprising single-layered stairs formed along the second direction, and
    wherein an upper portion of the electrode structure comprises an upper staircase structure comprising single-layered stairs formed along the first direction.

13. The 3D semiconductor memory device of claim 12, wherein the plurality of dummy structures is laterally spaced apart from the upper portion of the electrode structure.

14. A three-dimensional (3D) semiconductor memory device comprising:
- a substrate comprising a cell array region and a connection region adjacent to the cell array region;
- an electrode structure comprising a plurality of electrodes vertically stacked on the substrate, the electrode structure comprising an upper portion having an upper staircase structure formed along a first direction on the connection region;
- a first dummy structure laterally spaced apart from the upper portion of the electrode structure and comprising first dummy patterns vertically stacked; and
- a second dummy structure laterally spaced apart from the upper portion of the electrode structure and comprising second dummy patterns vertically stacked,
- wherein each of the first dummy structure and the second dummy structure comprising a dummy staircase structure formed along both the first direction and a second direction, the second direction intersecting the first direction,
- wherein the first dummy structure is located at a first level from the substrate, and the second dummy structure is located at a second level higher than the first level, and
- wherein a lowest step of the dummy staircase structure of the second dummy structure is disposed higher than a highest step of the dummy staircase structure of the first dummy structure.

15. The 3D semiconductor memory device of claim 14, wherein the electrode structure has a first width in the second direction, and
- wherein each of the first dummy structure and the second dummy structure has a second width in the second direction, which is less than half of the first width.

16. The 3D semiconductor memory device of claim 14, wherein the first dummy patterns have first sidewalls vertically aligned with each other, and
- wherein the second dummy patterns have second sidewalls vertically aligned with each other.

17. The 3D semiconductor memory device of claim 14, wherein one sidewall of the first dummy structure is substantially coplanar with one sidewall of the second dummy structure.

18. The 3D semiconductor memory device of claim 14, wherein a difference between the first level and the second level corresponds to at least four times a vertical pitch of the plurality of electrodes.

19. The 3D semiconductor memory device of claim 14, wherein the electrode structure comprises a lower staircase structure and a middle staircase structure which are formed along the first direction on the connection region, and
- wherein the middle staircase structure comprises multi-layered stairs formed along the first direction and single-layered stairs formed along the second direction.

20. The 3D semiconductor memory device of claim 14, wherein the electrode structure comprises a lower staircase structure and a middle staircase structure which are formed along the first direction on the connection region, and
- wherein the lower staircase structure comprises single-layered stairs formed along both the first direction and the second direction.

* * * * *